(12) United States Patent
Simolon et al.

(10) Patent No.: US 9,918,023 B2
(45) Date of Patent: Mar. 13, 2018

(54) SEGMENTED FOCAL PLANE ARRAY ARCHITECTURE

(71) Applicant: FLIR Systems, Inc., Wilsonville, OR (US)

(72) Inventors: Brian Simolon, Santa Barbara, CA (US); Eric A. Kurth, Santa Barbara, CA (US); Mark Nussmeier, Goleta, CA (US); Nicholas Högasten, Santa Barbara, CA (US); Theodore R. Hoelter, Goleta, CA (US); Katrin Strandemar, Rimbo (SE); Pierre Boulanger, Goleta, CA (US); Barbara Sharp, Santa Barbara, CA (US)

(73) Assignee: FLIR Systems, Inc., Wilsonville, OR (US)

( * ) Notice: Subject to any disclaimer, the term of this patent is extended or adjusted under 35 U.S.C. 154(b) by 154 days.

(21) Appl. No.: 14/106,696

(22) Filed: Dec. 13, 2013

(65) Prior Publication Data
US 2014/0184807 A1    Jul. 3, 2014

Related U.S. Application Data

(63) Continuation-in-part of application No. 14/101,245, filed on Dec. 9, 2013, now Pat. No. 9,706,139, which
(Continued)

(51) Int. Cl.
*H04N 5/33*       (2006.01)
*H04N 5/378*      (2011.01)
(Continued)

(52) U.S. Cl.
CPC .......... *H04N 5/33* (2013.01); *H01L 27/1469* (2013.01); *H01L 27/14634* (2013.01); *H04N 5/2257* (2013.01); *H04N 5/378* (2013.01)

(58) Field of Classification Search
CPC .......... H01L 27/14634; H01L 27/1469; H04N 5/2257; H04N 5/33; H04N 5/378
(Continued)

(56) References Cited

U.S. PATENT DOCUMENTS 6,107,618 A  *  8/2000  Fossum ................ H01L 25/167
                                                      250/208.1
6,348,951 B1     2/2002  Kim
(Continued)

FOREIGN PATENT DOCUMENTS

CN         2874947         2/2007
CN         2899321         5/2007
(Continued)

OTHER PUBLICATIONS

Sony, "Sony Develops Next-generation Back-Illuminated CMOS Image Sensor which Embodies the Continuous Evolution of the Camera—Expanding Shooting Enjoyment and Advanced Functionality of Smartphones and Other Devices-", http://www.sony.net/SonyInfo/News/Press/201201/12-009E/, Jan. 23, 2012, p. 1, Sony, Corporate Info.

*Primary Examiner* — Jamie Atala
*Assistant Examiner* — James Boylan
(74) *Attorney, Agent, or Firm* — Haynes and Boone, LLP

(57) ABSTRACT

Various techniques are provided for implementing a segmented focal plane array (FPA) of infrared sensors. In one example, a system includes a segmented FPA. The segmented FPA includes a top die having an array of infrared sensors (e.g., bolometers). The top die may also include a portion of a read-out integrated circuit (ROIC). The segmented FPA also includes a bottom die having at least a portion of the ROIC. The top and the bottom dies are electrically coupled via inter-die connections. Advantageously, the segmented FPA may be fabricated with a higher yield and a smaller footprint compared with conventional
(Continued)

FPA architectures. Moreover, the segmented FPA may be fabricated using different semiconductor processes for each die.

24 Claims, 16 Drawing Sheets

Related U.S. Application Data is a continuation of application No. PCT/US2012/041744, filed on Jun. 8, 2012, application No. 14/106,696, which is a continuation-in-part of application No. 14/099,818, filed on Dec. 6, 2013, now Pat. No. 9,723,227, which is a continuation of application No. PCT/US2012/041749, filed on Jun. 8, 2012, application No. 14/106,696, which is a continuation-in-part of application No. 14/101,258, filed on Dec. 9, 2013, now Pat. No. 9,723,228, which is a continuation of application No. PCT/US2012/041739, filed on Jun. 8, 2012, application No. 14/106,696, which is a continuation-in-part of application No. 13/437,645, filed on Apr. 2, 2012, now Pat. No. 9,171,361, which is a continuation-in-part of application No. 13/105,765, filed on May 11, 2011, now Pat. No. 8,565,547, which is a continuation-in-part of application No. 12/766,739, filed on Apr. 23, 2010, now Pat. No. 8,520,970, and a continuation of application No. PCT/EP2011/056432, filed on Apr. 21, 2011, and a continuation-in-part of application No. 12/766,739, filed on Apr. 23, 2010, now Pat. No. 8,520,970, said application No. PCT/EP2011/056432 is a continuation-in-part of application No. 12/766,739, filed on Apr. 23, 2010, now Pat. No. 8,520,970.

(60) Provisional application No. 61/737,660, filed on Dec. 14, 2012, provisional application No. 61/656,889, filed on Jun. 7, 2012, provisional application No. 61/545,056, filed on Oct. 7, 2011, provisional application No. 61/495,873, filed on Jun. 10, 2011, provisional application No. 61/495,879, filed on Jun. 10, 2011, provisional application No. 61/495,888, filed on Jun. 10, 2011, provisional application No. 61/473,207, filed on Apr. 8, 2011, provisional application No. 61/792,582, filed on Mar. 15, 2013, provisional application No. 61/748,018, filed on Dec. 31, 2012, provisional application No. 61/793,952, filed on Mar. 15, 2013, provisional application No. 61/746,069, filed on Dec. 26, 2012, provisional application No. 61/746,074, filed on Dec. 26, 2012.

(51) Int. Cl.
    *H01L 27/146* (2006.01)
    *H04N 5/225* (2006.01)

(58) Field of Classification Search
    USPC .............................................. 348/164; 438/67
    See application file for complete search history.

(56) References Cited

U.S. PATENT DOCUMENTS

| | | | |
|---|---|---|---|
| 6,396,543 B1 | 5/2002 | Shin et al. | |
| 6,424,843 B1 | 7/2002 | Reitmaa et al. | |
| 6,633,231 B1 | 10/2003 | Okamoto et al. | |
| 6,639,626 B1* | 10/2003 | Kubo | H04N 5/2258 348/218.1 |
| 6,649,913 B1* | 11/2003 | Kennedy | G01J 5/061 250/352 |
| 6,681,120 B1 | 1/2004 | Kim | |
| 6,911,652 B2 | 6/2005 | Walkenstein | |
| D524,785 S | 7/2006 | Huang | |
| 7,084,857 B2 | 8/2006 | Lieberman et al. | |
| 7,180,077 B1* | 2/2007 | Farhoomand | H01L 27/14603 250/338.4 |
| 7,263,379 B1 | 8/2007 | Parkulo et al. | |
| 7,284,921 B2 | 10/2007 | Lapstun et al. | |
| 7,296,747 B2 | 11/2007 | Rohs | |
| 7,305,368 B2 | 12/2007 | Lieberman et al. | |
| 7,321,783 B2 | 1/2008 | Kim | |
| 7,333,181 B1* | 2/2008 | Scott | F41G 3/147 257/E31.115 |
| 7,333,832 B2 | 2/2008 | Tsai et al. | |
| 7,377,835 B2 | 5/2008 | Parkulo et al. | |
| 7,477,309 B2 | 1/2009 | Cuccias | |
| 7,567,818 B2 | 7/2009 | Pylkko | |
| 7,575,077 B2 | 8/2009 | Priepke et al. | |
| 7,595,904 B2 | 9/2009 | Lapstun et al. | |
| 7,627,364 B2 | 12/2009 | Sato | |
| 7,697,962 B2 | 4/2010 | Cradick et al. | |
| 7,723,686 B2 | 5/2010 | Hannebauer | |
| 7,725,141 B2 | 5/2010 | Su | |
| 7,728,281 B2 | 6/2010 | Chen | |
| 7,735,974 B2 | 6/2010 | Silverbrook et al. | |
| 7,747,454 B2 | 6/2010 | Bartfeld et al. | |
| 7,760,919 B2 | 7/2010 | Namgoong | |
| 7,761,114 B2 | 7/2010 | Silverbrook et al. | |
| 7,773,870 B2 | 8/2010 | Naruse | |
| 7,801,733 B2 | 9/2010 | Lee et al. | |
| 7,810,733 B2 | 10/2010 | Silverbrook et al. | |
| 7,900,842 B2 | 3/2011 | Silverbrook et al. | |
| 7,903,152 B2 | 3/2011 | Kim | |
| 7,947,222 B2 | 5/2011 | Bae et al. | |
| 9,165,968 B2* | 10/2015 | Chao | H01L 27/14634 |
| 2001/0001562 A1* | 5/2001 | Orava | G01T 1/2928 348/302 |
| 2003/0122957 A1 | 7/2003 | Emme | |
| 2004/0127156 A1 | 7/2004 | Park | |
| 2004/0157612 A1 | 8/2004 | Kim | |
| 2004/0200961 A1* | 10/2004 | Parrish | G01J 5/02 250/338.1 |
| 2004/0211901 A1 | 10/2004 | Syllaios et al. | |
| 2005/0067852 A1 | 3/2005 | Jeong | |
| 2005/0248912 A1 | 11/2005 | Kang et al. | |
| 2005/0277447 A1 | 12/2005 | Buil et al. | |
| 2006/0039686 A1 | 2/2006 | Soh et al. | |
| 2006/0044071 A1* | 3/2006 | Hairston | H03F 1/223 330/311 |
| 2006/0060984 A1 | 3/2006 | Wakabayashi et al. | |
| 2006/0077246 A1 | 4/2006 | Kawakami et al. | |
| 2006/0097172 A1 | 5/2006 | Park | |
| 2006/0147191 A1 | 7/2006 | Kim | |
| 2006/0154559 A1 | 7/2006 | Yoshida | |
| 2006/0234744 A1 | 10/2006 | Sung et al. | |
| 2006/0240867 A1 | 10/2006 | Wang et al. | |
| 2006/0285907 A1 | 12/2006 | Kang et al. | |
| 2007/0019077 A1 | 1/2007 | Park | |
| 2007/0019099 A1 | 1/2007 | Lieberman et al. | |
| 2007/0019103 A1 | 1/2007 | Lieberman et al. | |
| 2007/0033309 A1 | 2/2007 | Kuwabara et al. | |
| 2007/0034800 A1 | 2/2007 | Huang | |
| 2007/0057764 A1 | 3/2007 | Sato et al. | |
| 2007/0120879 A1 | 5/2007 | Kanade et al. | |
| 2007/0189583 A1 | 8/2007 | Shimada et al. | |
| 2007/0211965 A1 | 9/2007 | Helbing et al. | |
| 2007/0274541 A1 | 11/2007 | Uetake et al. | |
| 2007/0299226 A1 | 12/2007 | Park et al. | |
| 2008/0038579 A1 | 2/2008 | Schuisky et al. | |
| 2008/0151056 A1 | 6/2008 | Ahamefula | |
| 2008/0248833 A1 | 10/2008 | Silverbrook et al. | |
| 2008/0266079 A1 | 10/2008 | Lontka | |
| 2008/0278772 A1 | 11/2008 | Silverbrook et al. | |
| 2008/0292144 A1 | 11/2008 | Kim | |
| 2008/0297614 A1 | 12/2008 | Lieberman et al. | |
| 2008/0302956 A1* | 12/2008 | Anderson | H04N 5/33 250/252.1 |

(56) References Cited

U.S. PATENT DOCUMENTS

| | | | |
|---|---|---|---|
| 2009/0023421 A1 | 1/2009 | Parkulo et al. | |
| 2009/0040042 A1 | 2/2009 | Lontka | |
| 2009/0131104 A1 | 5/2009 | Yoon | |
| 2009/0135033 A1* | 5/2009 | Huppertz | H03M 3/384 341/118 |
| 2009/0215479 A1 | 8/2009 | Karmarkar | |
| 2009/0227287 A1 | 9/2009 | Kotidis | |
| 2009/0238238 A1 | 9/2009 | Hollander et al. | |
| 2009/0278048 A1 | 11/2009 | Choe et al. | |
| 2009/0297062 A1 | 12/2009 | Molne et al. | |
| 2010/0084556 A1* | 4/2010 | Oh | H01L 27/14601 250/338.4 |
| 2010/0090983 A1 | 4/2010 | Challener et al. | |
| 2010/0103141 A1 | 4/2010 | Challener et al. | |
| 2010/0109624 A1* | 5/2010 | Lourens | G05F 1/575 323/280 |
| 2010/0113068 A1 | 5/2010 | Rothschild | |
| 2010/0131268 A1 | 5/2010 | Moeller | |
| 2010/0140732 A1* | 6/2010 | Eminoglu | H01L 27/14634 257/447 |
| 2010/0144387 A1 | 6/2010 | Chou | |
| 2010/0163730 A1 | 7/2010 | Schmidt et al. | |
| 2010/0234067 A1 | 9/2010 | Silverbrook et al. | |
| 2010/0245582 A1 | 9/2010 | Harel | |
| 2010/0245585 A1 | 9/2010 | Fisher et al. | |
| 2010/0314543 A1 | 12/2010 | Lee et al. | |
| 2011/0043486 A1 | 2/2011 | Hagiwara et al. | |
| 2011/0063446 A1 | 3/2011 | McMordie et al. | |
| 2011/0102599 A1 | 5/2011 | Kwon et al. | |
| 2011/0117532 A1 | 5/2011 | Relyea et al. | |
| 2011/0121978 A1 | 5/2011 | Schwörer et al. | |
| 2011/0122075 A1 | 5/2011 | Seo et al. | |
| 2011/0128384 A1 | 6/2011 | Tiscareno et al. | |
| 2011/0205100 A1* | 8/2011 | Bogaerts | H04N 5/3575 341/169 |
| 2011/0233609 A1* | 9/2011 | Cordat | H01L 27/1465 257/189 |

FOREIGN PATENT DOCUMENTS

| | | |
|---|---|---|
| CN | 201203922 | 3/2009 |
| CN | 101635754 | 1/2010 |
| CN | 101859209 | 10/2010 |
| CN | 101945154 | 1/2011 |
| CN | 102055836 | 5/2011 |
| EP | 2546623 | 1/2013 |
| GB | 2411521 | 8/2005 |
| JP | 2004048571 | 2/2004 |
| JP | 2006098098 | 4/2006 |
| JP | 2007325842 | 12/2007 |
| KR | 100227582 | 11/2000 |
| KR | 20000073381 | 12/2000 |
| KR | 100285817 | 1/2001 |
| KR | 20010001341 | 1/2001 |
| KR | 20010002462 | 1/2001 |
| KR | 20010010010 | 2/2001 |
| KR | 20010014992 | 2/2001 |
| KR | 20010050263 | 6/2001 |
| KR | 20010068202 | 7/2001 |
| KR | 20010070355 | 7/2001 |
| KR | 20020006967 | 1/2002 |
| KR | 20020061920 | 7/2002 |
| KR | 20020078469 | 10/2002 |
| KR | 20020083961 | 11/2002 |
| KR | 20020085490 | 11/2002 |
| KR | 20020095752 | 12/2002 |
| KR | 20030000332 | 1/2003 |
| KR | 20030007030 | 1/2003 |
| KR | 20030012444 | 2/2003 |
| KR | 20030016607 | 3/2003 |
| KR | 20030024545 | 3/2003 |
| KR | 20030051140 | 6/2003 |
| KR | 20030056667 | 7/2003 |
| KR | 20030085742 | 11/2003 |
| KR | 20030088968 | 11/2003 |
| KR | 20040001684 | 1/2004 |
| KR | 20040001686 | 1/2004 |
| KR | 20040027692 | 4/2004 |
| KR | 20040033223 | 4/2004 |
| KR | 20040033532 | 4/2004 |
| KR | 20040033986 | 4/2004 |
| KR | 20040039868 | 5/2004 |
| KR | 20040040296 | 5/2004 |
| KR | 20040042475 | 5/2004 |
| KR | 20040044624 | 5/2004 |
| KR | 20040064855 | 7/2004 |
| KR | 20040066724 | 7/2004 |
| KR | 20040068864 | 8/2004 |
| KR | 20040076308 | 9/2004 |
| KR | 20040086994 | 10/2004 |
| KR | 20040102386 | 12/2004 |
| KR | 20050011313 | 1/2005 |
| KR | 20050012505 | 2/2005 |
| KR | 20050014448 | 2/2005 |
| KR | 20050015293 | 2/2005 |
| KR | 20050015745 | 2/2005 |
| KR | 20050018370 | 2/2005 |
| KR | 20050023950 | 3/2005 |
| KR | 101006660 | 9/2005 |
| KR | 20060023957 | 3/2006 |
| KR | 100645746 | 5/2006 |
| KR | 100633792 | 10/2006 |
| KR | 20060119077 | 11/2006 |
| KR | 20060119236 | 11/2006 |
| KR | 20060120318 | 11/2006 |
| KR | 20060121595 | 11/2006 |
| KR | 100660125 | 12/2006 |
| KR | 100663528 | 1/2007 |
| KR | 20070002590 | 1/2007 |
| KR | 20070005263 | 1/2007 |
| KR | 20070009380 | 1/2007 |
| KR | 20070028201 | 3/2007 |
| KR | 100729813 | 6/2007 |
| KR | 20070067650 | 6/2007 |
| KR | 20070078477 | 8/2007 |
| KR | 20070082960 | 8/2007 |
| KR | 20070087513 | 8/2007 |
| KR | 20070091486 | 9/2007 |
| KR | 100766953 | 10/2007 |
| KR | 100771364 | 10/2007 |
| KR | 20070104957 | 10/2007 |
| KR | 20070115754 | 12/2007 |
| KR | 20070122344 | 12/2007 |
| KR | 20070122345 | 12/2007 |
| KR | 20080013314 | 2/2008 |
| KR | 20080015099 | 2/2008 |
| KR | 20080015100 | 2/2008 |
| KR | 100822053 | 4/2008 |
| KR | 20080045551 | 5/2008 |
| KR | 100841243 | 6/2008 |
| KR | 20080054596 | 6/2008 |
| KR | 20080069007 | 7/2008 |
| KR | 20080071070 | 8/2008 |
| KR | 20080078315 | 8/2008 |
| KR | 100866475 | 11/2008 |
| KR | 100866476 | 11/2008 |
| KR | 20080096918 | 11/2008 |
| KR | 20080098409 | 11/2008 |
| KR | 100871916 | 12/2008 |
| KR | 20080112331 | 12/2008 |
| KR | 20090018486 | 2/2009 |
| KR | 20090020864 | 2/2009 |
| KR | 20090036734 | 4/2009 |
| KR | 100901784 | 6/2009 |
| KR | 20090105424 | 10/2009 |
| KR | 20100059681 | 6/2010 |
| KR | 20100070119 | 6/2010 |
| KR | 20100072994 | 7/2010 |
| KR | 20100089125 | 8/2010 |
| KR | 20100090521 | 8/2010 |
| KR | 20100091758 | 8/2010 |
| KR | 20100098958 | 9/2010 |
| KR | 100985816 | 10/2010 |

(56) References Cited

FOREIGN PATENT DOCUMENTS

| | | |
|---|---|---|
| KR | 20100123021 | 11/2010 |
| KR | 20110006437 | 1/2011 |
| KR | 20110011264 | 2/2011 |
| KR | 2011024290 | 3/2011 |
| WO | WO 98/35212 | 8/1998 |
| WO | WO 98/54554 | 12/1998 |
| WO | WO 03/093963 | 11/2003 |
| WO | WO 2005/002228 | 1/2005 |
| WO | WO 2005/088846 | 9/2005 |
| WO | WO 2006/112866 | 10/2006 |
| WO | WO 2007/006242 | 1/2007 |
| WO | WO 2009/122114 | 10/2009 |
| WO | WO 2010/005152 | 1/2010 |
| WO | WO 2010/033142 | 3/2010 |
| WO | WO 2012/121526 | 9/2012 |

\* cited by examiner

SEGMENTED FOCAL PLANE ARRAY ARCHITECTURE

CROSS-REFERENCE TO RELATED APPLICATIONS

This application claims the benefit of U.S. Provisional Patent Application No. 61/737,660 filed Dec. 14, 2012 and entitled "SEGMENTED FOCAL PLANE ARRAY ARCHITECTURE" which is hereby incorporated by reference in its entirety.

This application is a continuation-in-part of U.S. patent application Ser. No. 14/101,245 filed Dec. 9, 2013 and entitled "LOW POWER AND SMALL FORM FACTOR INFRARED IMAGING" which is hereby incorporated by reference in its entirety.

U.S. patent application Ser. No. 14/101,245 is a continuation of International Patent Application No. PCT/US2012/041744 filed Jun. 8, 2012 and entitled "LOW POWER AND SMALL FORM FACTOR INFRARED IMAGING" which is hereby incorporated by reference in its entirety.

International Patent Application No. PCT/US2012/041744 claims the benefit of U.S. Provisional Patent Application No. 61/656,889 filed Jun. 7, 2012 and entitled "LOW POWER AND SMALL FORM FACTOR INFRARED IMAGING" which is hereby incorporated by reference in its entirety.

International Patent Application No. PCT/US2012/041744 claims the benefit of U.S. Provisional Patent Application No. 61/545,056 filed Oct. 7, 2011 and entitled "NON-UNIFORMITY CORRECTION TECHNIQUES FOR INFRARED IMAGING DEVICES" which is hereby incorporated by reference in its entirety.

International Patent Application No. PCT/US2012/041744 claims the benefit of U.S. Provisional Patent Application No. 61/495,873 filed Jun. 10, 2011 and entitled "INFRARED CAMERA PACKAGING SYSTEMS AND METHODS" which is hereby incorporated by reference in its entirety.

International Patent Application No. PCT/US2012/041744 claims the benefit of U.S. Provisional Patent Application No. 61/495,879 filed Jun. 10, 2011 and entitled "INFRARED CAMERA SYSTEM ARCHITECTURES" which is hereby incorporated by reference in its entirety.

International Patent Application No. PCT/US2012/041744 claims the benefit of U.S. Provisional Patent Application No. 61/495,888 filed Jun. 10, 2011 and entitled "INFRARED CAMERA CALIBRATION TECHNIQUES" which is hereby incorporated by reference in its entirety.

This application is a continuation-in-part of U.S. patent application Ser. No. 14/099,818 filed Dec. 6, 2013 and entitled "NON-UNIFORMITY CORRECTION TECHNIQUES FOR INFRARED IMAGING DEVICES" which is hereby incorporated by reference in its entirety.

U.S. patent application Ser. No. 14/099,818 is a continuation of International Patent Application No. PCT/US2012/041749 filed Jun. 8, 2012 and entitled "NON-UNIFORMITY CORRECTION TECHNIQUES FOR INFRARED IMAGING DEVICES" which is hereby incorporated by reference in its entirety.

International Patent Application No. PCT/US2012/041749 claims the benefit of U.S. Provisional Patent Application No. 61/545,056 filed Oct. 7, 2011 and entitled "NON-UNIFORMITY CORRECTION TECHNIQUES FOR INFRARED IMAGING DEVICES" which is hereby incorporated by reference in its entirety.

International Patent Application No. PCT/US2012/041749 claims the benefit of U.S. Provisional Patent Application No. 61/495,873 filed Jun. 10, 2011 and entitled "INFRARED CAMERA PACKAGING SYSTEMS AND METHODS" which is hereby incorporated by reference in its entirety.

International Patent Application No. PCT/US2012/041749 claims the benefit of U.S. Provisional Patent Application No. 61/495,879 filed Jun. 10, 2011 and entitled "INFRARED CAMERA SYSTEM ARCHITECTURES" which is hereby incorporated by reference in its entirety.

International Patent Application No. PCT/US2012/041749 claims the benefit of U.S. Provisional Patent Application No. 61/495,888 filed Jun. 10, 2011 and entitled "INFRARED CAMERA CALIBRATION TECHNIQUES" which is hereby incorporated by reference in its entirety.

This application is a continuation-in-part of U.S. patent application Ser. No. 14/101,258 filed Dec. 9, 2013 and entitled "INFRARED CAMERA SYSTEM ARCHITECTURES" which is hereby incorporated by reference in its entirety.

U.S. patent application Ser. No. 14/101,258 is a continuation of International Patent Application No. PCT/US2012/041739 filed Jun. 8, 2012 and entitled "INFRARED CAMERA SYSTEM ARCHITECTURES" which is hereby incorporated by reference in its entirety.

International Patent Application No. PCT/US2012/041739 claims the benefit of U.S. Provisional Patent Application No. 61/495,873 filed Jun. 10, 2011 and entitled "INFRARED CAMERA PACKAGING SYSTEMS AND METHODS" which is hereby incorporated by reference in its entirety.

International Patent Application No. PCT/US2012/041739 claims the benefit of U.S. Provisional Patent Application No. 61/495,879 filed Jun. 10, 2011 and entitled "INFRARED CAMERA SYSTEM ARCHITECTURES" which is hereby incorporated by reference in its entirety.

International Patent Application No. PCT/US2012/041739 claims the benefit of U.S. Provisional Patent Application No. 61/495,888 filed Jun. 10, 2011 and entitled "INFRARED CAMERA CALIBRATION TECHNIQUES" which is hereby incorporated by reference in its entirety.

This patent application is a continuation-in-part of U.S. patent application Ser. No. 13/437,645 filed Apr. 2, 2012 and entitled "INFRARED RESOLUTION AND CONTRAST ENHANCEMENT WITH FUSION" which is hereby incorporated by reference in its entirety.

U.S. patent application Ser. No. 13/437,645 is a continuation-in-part of U.S. patent application Ser. No. 13/105,765 filed May 11, 2011 and entitled "INFRARED RESOLUTION AND CONTRAST ENHANCEMENT WITH FUSION" which is hereby incorporated by reference in its entirety.

U.S. patent application Ser. No. 13/437,645 also claims the benefit of U.S. Provisional Patent Application No. 61/473,207 filed Apr. 8, 2011 and entitled "INFRARED RESOLUTION AND CONTRAST ENHANCEMENT WITH FUSION" which is hereby incorporated by reference in its entirety.

U.S. patent application Ser. No. 13/437,645 is also a continuation-in-part of U.S. patent application Ser. No. 12/766,739 filed Apr. 23, 2010 and entitled "INFRARED RESOLUTION AND CONTRAST ENHANCEMENT WITH FUSION" which is hereby incorporated by reference in its entirety.

U.S. patent application Ser. No. 13/105,765 is a continuation of International Patent Application No. PCT/EP2011/

056432 filed Apr. 21, 2011 and entitled "INFRARED RESOLUTION AND CONTRAST ENHANCEMENT WITH FUSION" which is hereby incorporated by reference in its entirety.

U.S. patent application Ser. No. 13/105,765 is also a continuation-in-part of U.S. patent application Ser. No. 12/766,739 which is hereby incorporated by reference in its entirety.

International Patent Application No. PCT/EP2011/056432 is a continuation-in-part of U.S. patent application Ser. No. 12/766,739 which is hereby incorporated by reference in its entirety.

International Patent Application No. PCT/EP2011/056432 also claims the benefit of U.S. Provisional Patent Application No. 61/473,207 which is hereby incorporated by reference in its entirety.

This application claims the benefit of U.S. Provisional Patent Application No. 61/748,018 filed Dec. 31, 2012 and entitled "COMPACT MULTI-SPECTRUM IMAGING WITH FUSION" which is hereby incorporated by reference in its entirety.

This application claims the benefit of U.S. Provisional Patent Application No. 61/792,582 filed Mar. 15, 2013 and entitled "TIME SPACED INFRARED IMAGE ENHANCEMENT" which is hereby incorporated by reference in its entirety.

This application claims the benefit of U.S. Provisional Patent Application No. 61/793,952 filed Mar. 15, 2013 and entitled "INFRARED IMAGING ENHANCEMENT WITH FUSION" which is hereby incorporated by reference in its entirety.

This application claims the benefit of U.S. Provisional Patent Application No. 61/746,069 filed Dec. 26, 2012 and entitled "TIME SPACED INFRARED IMAGE ENHANCEMENT" which is hereby incorporated by reference in its entirety.

This application claims the benefit of U.S. Provisional Patent Application No. 61/746,074 filed Dec. 26, 2012 and entitled "INFRARED IMAGING ENHANCEMENT WITH FUSION" which is hereby incorporated by reference in its entirety.

TECHNICAL FIELD

One or more embodiments of the invention relate generally to thermal imaging devices and more particularly, for example, to focal plane array architectures of such devices.

BACKGROUND

Existing infrared imaging devices, such as infrared cameras, are often implemented using a focal plane array (FPA) fabricated on a monolithic silicon substrate. A typical FPA includes an array of bolometers coupled to a read out integrated circuit (ROIC) that translates resistance changes in the bolometers into multiplexed electrical signals representing captured infrared images.

Modern FPAs are becoming more and more complex due to the inclusion of various circuits and components in the ROIC to, for example, compensate for non-uniformities and/or temperature-dependent variations in bolometer outputs. It has also been a modern trend to include various support circuits and components such as, for example, analog-to-digital converters (ADCs) in the ROIC, increasing the complexity of modern FPAs even further.

Such increased complexity has led to many difficulties. For example, as monolithic FPAs become more complex, the yield in fabricating such FPAs may decrease and the cost of designing such FPAs may increase. Moreover, the inclusion of additional circuitry may lead to an increase in die size, which is in conflict with the desire to decrease the size of FPAs for application in small devices. Such problems may be aggravated by the limitations of semiconductor fabrication processes when bolometers and ROIC components are manufactured in monolithic FPAs.

SUMMARY

Various techniques are provided for implementing a segmented focal plane array (FPA) of infrared sensors. In one example, a system includes a segmented FPA. The segmented FPA includes a top die having an array of infrared sensors (e.g., bolometers). The top die may also include a portion of a read-out integrated circuit (ROIC). The segmented FPA also includes a bottom die having at least a portion of the ROIC. The top and the bottom dies are electrically coupled via inter-die connections. Advantageously, the segmented FPA may be fabricated with a higher yield and a smaller footprint compared with conventional FPA architectures. Moreover, the segmented FPA may be fabricated using different semiconductor processes for each die.

In one embodiment, a system includes a FPA comprising: a first die comprising an array of active bolometers adapted to receive infrared (IR) radiation from a scene; a second die stacked relative to the first die and comprising at least a portion of a read-out integrated circuit (ROIC); and a plurality of inter-die connections adapted to pass signals between the first die and the second die, wherein the passed signals are used to generate output values corresponding to the IR radiation received at the active bolometers.

In another embodiment, a method includes fabricating a first die comprising an array of active bolometers adapted to receive infrared (IR) radiation from a scene; fabricating a second die comprising at least a portion of a read-out integrated circuit (ROIC); forming a plurality of inter-die connections adapted to pass signals between the first die and the second die, wherein the passed signals are used to generate output values corresponding to the IR radiation received at the active bolometers; stacking the first and second dies relative to each other; and wherein the first die, the second die, and the inter-die connections are part of a segmented focal plane array (FPA).

In another embodiment, a method includes receiving infrared (IR) radiation from a scene at a segmented focal plane array (FPA) comprising: a first die comprising an array of active bolometers, a second die stacked relative to the first die and comprising at least a portion of a read-out integrated circuit (ROIC), and a plurality of inter-die connections between the first die and the second die; passing signals between the first die and the second die through the inter-die connections; and generating output values corresponding to the IR radiation received at the active bolometers, wherein the passed signals are used to perform the generating.

The scope of the invention is defined by the claims, which are incorporated into this section by reference. A more complete understanding of embodiments of the invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the invention and their advantages are best understood by referring to the detailed description that follows. It should be appreciated that like reference numerals are used to identify like elements illustrated in one or more of the figures.

DETAILED DESCRIPTION

Figure 1:
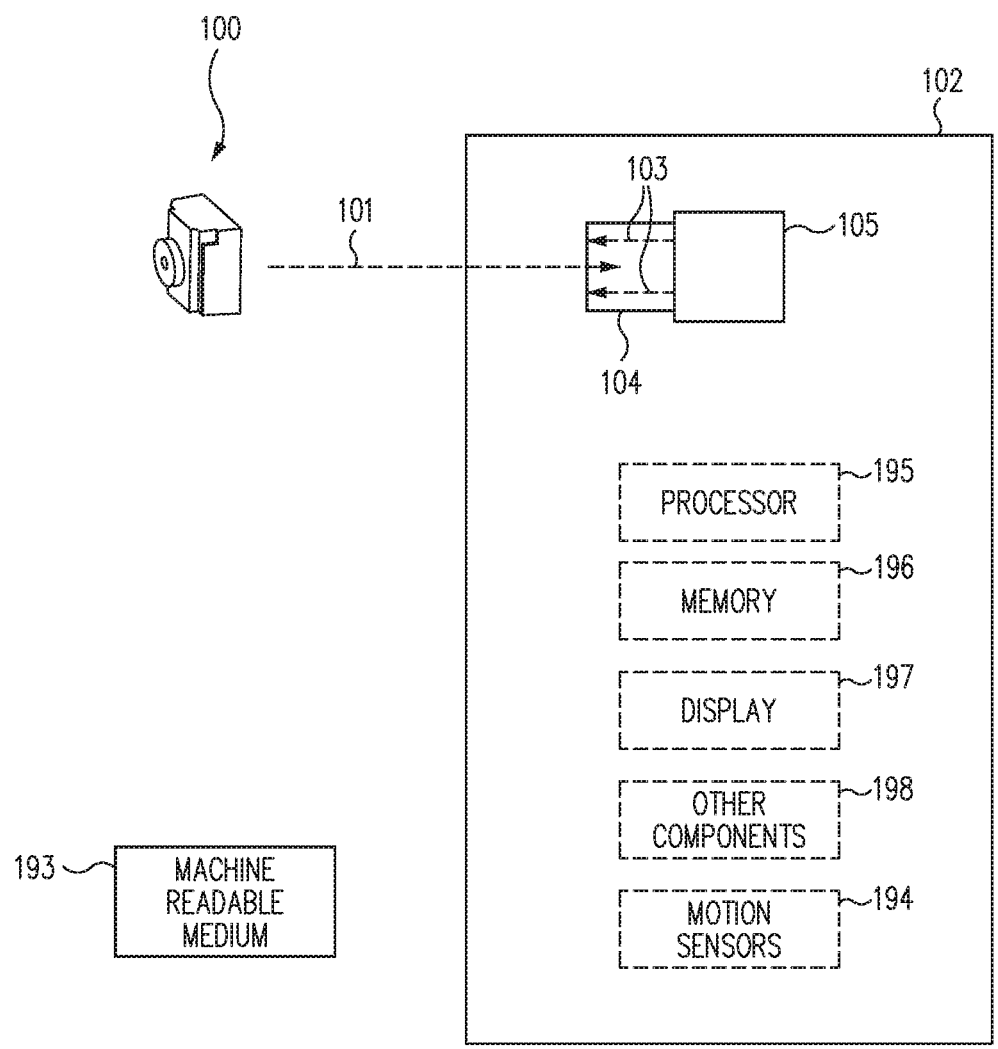
FIG. 1 illustrates an infrared imaging module configured to be implemented in a host device in accordance with an embodiment of the disclosure.

FIG. 1 illustrates an infrared imaging module 100 (e.g., an infrared camera or an infrared imaging device) configured to be implemented in a host device 102 in accordance with an embodiment of the disclosure. Infrared imaging module 100 may be implemented, for one or more embodiments, with a small form factor and in accordance with wafer level packaging techniques or other packaging techniques.

In one embodiment, infrared imaging module 100 may be configured to be implemented in a small portable host device 102, such as a mobile telephone, a tablet computing device, a laptop computing device, a personal digital assistant, a visible light camera, a music player, or any other appropriate mobile device. In this regard, infrared imaging module 100 may be used to provide infrared imaging features to host device 102. For example, infrared imaging module 100 may be configured to capture, process, and/or otherwise manage infrared images and provide such infrared images to host device 102 for use in any desired fashion (e.g., for further processing, to store in memory, to display, to use by various applications running on host device 102, to export to other devices, or other uses).

In various embodiments, infrared imaging module 100 may be configured to operate at low voltage levels and over a wide temperature range. For example, in one embodiment, infrared imaging module 100 may operate using a power supply of approximately 2.4 volts, 2.5 volts, 2.8 volts, or lower voltages, and operate over a temperature range of approximately −20 degrees C. to approximately +60 degrees C. (e.g., providing a suitable dynamic range and performance over an environmental temperature range of approximately 80 degrees C.). In one embodiment, by operating infrared imaging module 100 at low voltage levels, infrared imaging module 100 may experience reduced amounts of self heating in comparison with other types of infrared imaging devices. As a result, infrared imaging module 100 may be operated with reduced measures to compensate for such self heating.

Figure 2:
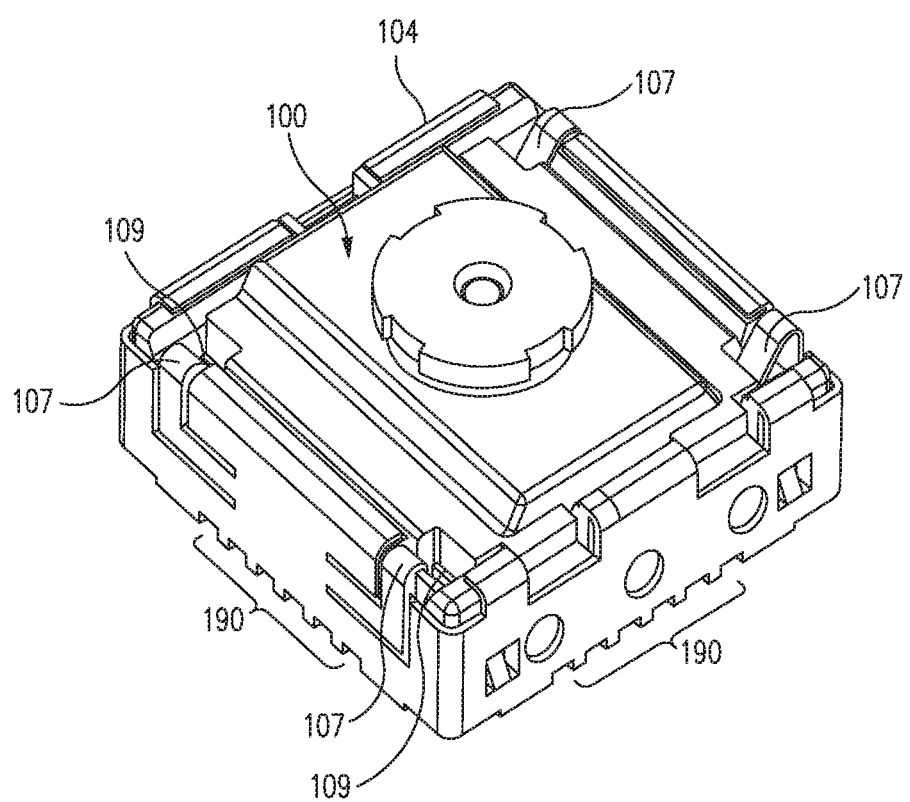
FIG. 2 illustrates an assembled infrared imaging module in accordance with an embodiment of the disclosure.

As shown in FIG. 1, host device 102 may include a socket 104, a shutter 105, motion sensors 194, a processor 195, a memory 196, a display 197, and/or other components 198. Socket 104 may be configured to receive infrared imaging module 100 as identified by arrow 101. In this regard, FIG. 2 illustrates infrared imaging module 100 assembled in socket 104 in accordance with an embodiment of the disclosure.

Motion sensors 194 may be implemented by one or more accelerometers, gyroscopes, or other appropriate devices that may be used to detect movement of host device 102. Motion sensors 194 may be monitored by and provide information to processing module 160 or processor 195 to detect motion. In various embodiments, motion sensors 194 may be implemented as part of host device 102 (as shown in FIG. 1), infrared imaging module 100, or other devices attached to or otherwise interfaced with host device 102.

Processor 195 may be implemented as any appropriate processing device (e.g., logic device, microcontroller, processor, application specific integrated circuit (ASIC), or other device) that may be used by host device 102 to execute appropriate instructions, such as software instructions provided in memory 196. Display 197 may be used to display captured and/or processed infrared images and/or other images, data, and information. Other components 198 may be used to implement any features of host device 102 as may be desired for various applications (e.g., clocks, temperature sensors, a visible light camera, or other components). In addition, a machine readable medium 193 may be provided for storing non-transitory instructions for loading into memory 196 and execution by processor 195.

In various embodiments, infrared imaging module 100 and socket 104 may be implemented for mass production to facilitate high volume applications, such as for implementation in mobile telephones or other devices (e.g., requiring small form factors). In one embodiment, the combination of infrared imaging module 100 and socket 104 may exhibit overall dimensions of approximately 8.5 mm by 8.5 mm by 5.9 mm while infrared imaging module 100 is installed in socket 104.

Figure 3:
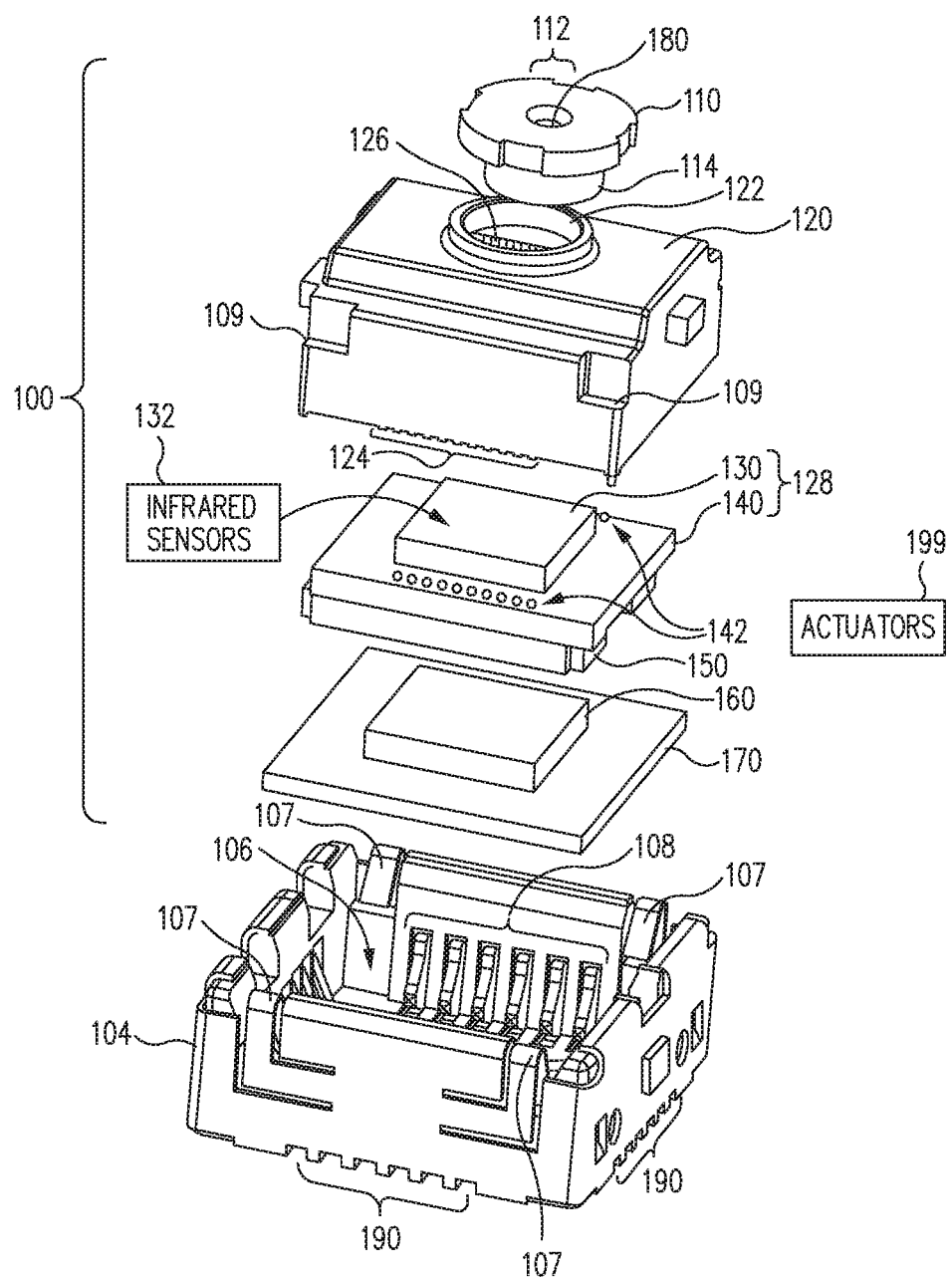
FIG. 3 illustrates an exploded view of an infrared imaging module juxtaposed over a socket in accordance with an embodiment of the disclosure.

FIG. 3 illustrates an exploded view of infrared imaging module 100 juxtaposed over socket 104 in accordance with an embodiment of the disclosure. Infrared imaging module 100 may include a lens barrel 110, a housing 120, an infrared sensor assembly 128, a circuit board 170, a base 150, and a processing module 160.

Lens barrel 110 may at least partially enclose an optical element 180 (e.g., a lens) which is partially visible in FIG. 3 through an aperture 112 in lens barrel 110. Lens barrel 110 may include a substantially cylindrical extension 114 which may be used to interface lens barrel 110 with an aperture 122 in housing 120.

Infrared sensor assembly 128 may be implemented, for example, with a cap 130 (e.g., a lid) mounted on a substrate 140. Infrared sensor assembly 128 may include a plurality of infrared sensors 132 (e.g., infrared detectors) implemented in an array or other fashion on substrate 140 and covered by cap 130. For example, in one embodiment, infrared sensor assembly 128 may be implemented as a focal plane array (FPA). Such a focal plane array may be implemented, for example, as a vacuum package assembly (e.g., sealed by cap 130 and substrate 140). In one embodiment, infrared sensor assembly 128 may be implemented as a wafer level package (e.g., infrared sensor assembly 128 may be singulated from a set of vacuum package assemblies provided on a wafer). In one embodiment, infrared sensor assembly 128 may be implemented to operate using a power supply of approximately 2.4 volts, 2.5 volts, 2.8 volts, or similar voltages.

Infrared sensors 132 may be configured to detect infrared radiation (e.g., infrared energy) from a target scene including, for example, mid wave infrared wave bands (MWIR), long wave infrared wave bands (LWIR), and/or other thermal imaging bands as may be desired in particular implementations. In one embodiment, infrared sensor assembly 128 may be provided in accordance with wafer level packaging techniques.

Infrared sensors 132 may be implemented, for example, as microbolometers or other types of thermal imaging infrared sensors arranged in any desired array pattern to provide a plurality of pixels. In one embodiment, infrared sensors 132 may be implemented as vanadium oxide (VOx) detectors with a 17 μm pixel pitch. In various embodiments, arrays of approximately 32 by 32 infrared sensors 132, approximately 64 by 64 infrared sensors 132, approximately 80 by 64 infrared sensors 132, or other array sizes may be used.

Substrate 140 may include various circuitry including, for example, a read out integrated circuit (ROIC) with dimensions less than approximately 5.5 mm by 5.5 mm in one embodiment. Substrate 140 may also include bond pads 142 that may be used to contact complementary connections positioned on inside surfaces of housing 120 when infrared imaging module 100 is assembled as shown in FIG. 3. In one embodiment, the ROIC may be implemented with low-dropout regulators (LDO) to perform voltage regulation to reduce power supply noise introduced to infrared sensor assembly 128 and thus provide an improved power supply rejection ratio (PSRR). Moreover, by implementing the LDO with the ROIC (e.g., within a wafer level package), less die area may be consumed and fewer discrete die (or chips) are needed.

Figure 4:
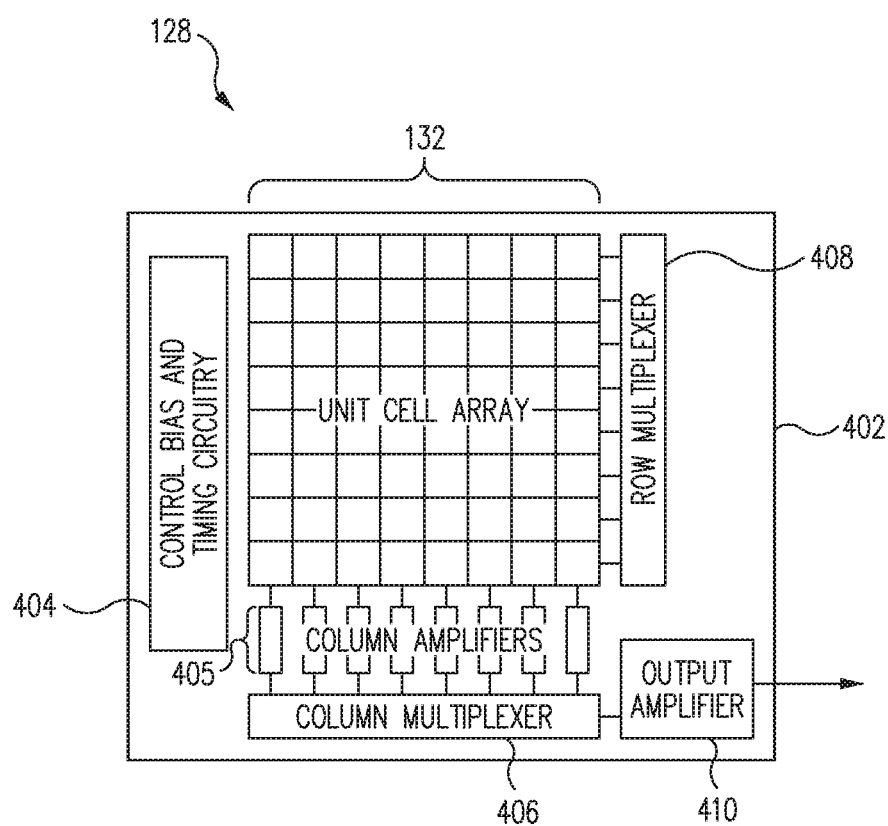
FIG. 4 illustrates a block diagram of an infrared sensor assembly including an array of infrared sensors in accordance with an embodiment of the disclosure.

FIG. 4 illustrates a block diagram of infrared sensor assembly 128 including an array of infrared sensors 132 in accordance with an embodiment of the disclosure. In the illustrated embodiment, infrared sensors 132 are provided as part of a unit cell array of a ROIC 402. ROIC 402 includes bias generation and timing control circuitry 404, column amplifiers 405, a column multiplexer 406, a row multiplexer 408, and an output amplifier 410. Image frames (e.g., thermal images) captured by infrared sensors 132 may be provided by output amplifier 410 to processing module 160, processor 195, and/or any other appropriate components to perform various processing techniques described herein. Although an 8 by 8 array is shown in FIG. 4, any desired array configuration may be used in other embodiments. Further descriptions of ROICs and infrared sensors (e.g., microbolometer circuits) may be found in U.S. Pat. No. 6,028,309 issued Feb. 22, 2000, which is incorporated herein by reference in its entirety.

Infrared sensor assembly 128 may capture images (e.g., image frames) and provide such images from its ROIC at various rates. Processing module 160 may be used to perform appropriate processing of captured infrared images and may be implemented in accordance with any appropriate architecture. In one embodiment, processing module 160 may be implemented as an ASIC. In this regard, such an ASIC may be configured to perform image processing with high performance and/or high efficiency. In another embodiment, processing module 160 may be implemented with a general purpose central processing unit (CPU) which may be configured to execute appropriate software instructions to perform image processing, coordinate and perform image processing with various image processing blocks, coordinate interfacing between processing module 160 and host device 102, and/or other operations. In yet another embodiment, processing module 160 may be implemented with a field programmable gate array (FPGA). Processing module 160 may be implemented with other types of processing and/or logic circuits in other embodiments as would be understood by one skilled in the art.

In these and other embodiments, processing module 160 may also be implemented with other components where appropriate, such as, volatile memory, non-volatile memory, and/or one or more interfaces (e.g., infrared detector interfaces, inter-integrated circuit (I2C) interfaces, mobile industry processor interfaces (MIPI), joint test action group (JTAG) interfaces (e.g., IEEE 1149.1 standard test access port and boundary-scan architecture), and/or other interfaces).

In some embodiments, infrared imaging module 100 may further include one or more actuators 199 which may be used to adjust the focus of infrared image frames captured by infrared sensor assembly 128. For example, actuators 199 may be used to move optical element 180, infrared sensors 132, and/or other components relative to each other to selectively focus and defocus infrared image frames in accordance with techniques described herein. Actuators 199 may be implemented in accordance with any type of motion-inducing apparatus or mechanism, and may positioned at any location within or external to infrared imaging module 100 as appropriate for different applications.

When infrared imaging module 100 is assembled, housing 120 may substantially enclose infrared sensor assembly 128, base 150, and processing module 160. Housing 120 may facilitate connection of various components of infrared imaging module 100. For example, in one embodiment, housing 120 may provide electrical connections 126 to connect various components as further described.

Electrical connections 126 (e.g., conductive electrical paths, traces, or other types of connections) may be electrically connected with bond pads 142 when infrared imaging module 100 is assembled. In various embodiments, electrical connections 126 may be embedded in housing 120, provided on inside surfaces of housing 120, and/or otherwise provided by housing 120. Electrical connections 126 may terminate in connections 124 protruding from the bottom surface of housing 120 as shown in FIG. 3. Connections 124 may connect with circuit board 170 when infrared imaging module 100 is assembled (e.g., housing 120 may rest atop circuit board 170 in various embodiments). Processing module 160 may be electrically connected with circuit board 170 through appropriate electrical connections. As a result, infrared sensor assembly 128 may be electrically connected with processing module 160 through, for example, conductive electrical paths provided by: bond pads 142, complementary connections on inside surfaces of housing 120, electrical connections 126 of housing 120, connections 124, and circuit board 170. Advantageously, such an arrangement may be implemented without requiring wire bonds to be provided between infrared sensor assembly 128 and processing module 160.

In various embodiments, electrical connections 126 in housing 120 may be made from any desired material (e.g., copper or any other appropriate conductive material). In one embodiment, electrical connections 126 may aid in dissipating heat from infrared imaging module 100.

Other connections may be used in other embodiments. For example, in one embodiment, sensor assembly 128 may be attached to processing module 160 through a ceramic board that connects to sensor assembly 128 by wire bonds and to processing module 160 by a ball grid array (BGA). In another embodiment, sensor assembly 128 may be mounted directly on a rigid flexible board and electrically connected with wire bonds, and processing module 160 may be mounted and connected to the rigid flexible board with wire bonds or a BGA.

The various implementations of infrared imaging module 100 and host device 102 set forth herein are provided for purposes of example, rather than limitation. In this regard, any of the various techniques described herein may be applied to any infrared camera system, infrared imager, or other device for performing infrared/thermal imaging.

Substrate 140 of infrared sensor assembly 128 may be mounted on base 150. In various embodiments, base 150 (e.g., a pedestal) may be made, for example, of copper formed by metal injection molding (MIM) and provided with a black oxide or nickel-coated finish. In various embodiments, base 150 may be made of any desired material, such as for example zinc, aluminum, or magnesium, as desired for a given application and may be formed by any desired applicable process, such as for example aluminum casting, MIM, or zinc rapid casting, as may be desired for particular applications. In various embodiments, base 150 may be implemented to provide structural support, various circuit paths, thermal heat sink properties, and other features where appropriate. In one embodiment, base 150 may be a multi-layer structure implemented at least in part using ceramic material.

In various embodiments, circuit board 170 may receive housing 120 and thus may physically support the various components of infrared imaging module 100. In various embodiments, circuit board 170 may be implemented as a printed circuit board (e.g., an FR4 circuit board or other types of circuit boards), a rigid or flexible interconnect (e.g., tape or other type of interconnects), a flexible circuit substrate, a flexible plastic substrate, or other appropriate structures. In various embodiments, base 150 may be implemented with the various features and attributes described for circuit board 170, and vice versa.

Socket 104 may include a cavity 106 configured to receive infrared imaging module 100 (e.g., as shown in the assembled view of FIG. 2). Infrared imaging module 100 and/or socket 104 may include appropriate tabs, arms, pins, fasteners, or any other appropriate engagement members which may be used to secure infrared imaging module 100 to or within socket 104 using friction, tension, adhesion, and/or any other appropriate manner. Socket 104 may include engagement members 107 that may engage surfaces 109 of housing 120 when infrared imaging module 100 is inserted into a cavity 106 of socket 104. Other types of engagement members may be used in other embodiments.

Infrared imaging module 100 may be electrically connected with socket 104 through appropriate electrical connections (e.g., contacts, pins, wires, or any other appropriate connections). For example, socket 104 may include electrical connections 108 which may contact corresponding electrical connections of infrared imaging module 100 (e.g., interconnect pads, contacts, or other electrical connections on side or bottom surfaces of circuit board 170, bond pads 142 or other electrical connections on base 150, or other connections). Electrical connections 108 may be made from any desired material (e.g., copper or any other appropriate conductive material). In one embodiment, electrical connections 108 may be mechanically biased to press against electrical connections of infrared imaging module 100 when infrared imaging module 100 is inserted into cavity 106 of socket 104. In one embodiment, electrical connections 108 may at least partially secure infrared imaging module 100 in socket 104. Other types of electrical connections may be used in other embodiments.

Socket 104 may be electrically connected with host device 102 through similar types of electrical connections. For example, in one embodiment, host device 102 may include electrical connections (e.g., soldered connections, snap-in connections, or other connections) that connect with electrical connections 108 passing through apertures 190. In various embodiments, such electrical connections may be made to the sides and/or bottom of socket 104.

Various components of infrared imaging module 100 may be implemented with flip chip technology which may be used to mount components directly to circuit boards without the additional clearances typically needed for wire bond connections. Flip chip connections may be used, as an example, to reduce the overall size of infrared imaging module 100 for use in compact small form factor applications. For example, in one embodiment, processing module 160 may be mounted to circuit board 170 using flip chip connections. For example, infrared imaging module 100 may be implemented with such flip chip configurations.

In various embodiments, infrared imaging module 100 and/or associated components may be implemented in accordance with various techniques (e.g., wafer level packaging techniques) as set forth in U.S. patent application Ser. No. 12/844,124 filed Jul. 27, 2010, and U.S. Provisional Patent Application No. 61/469,651 filed Mar. 30, 2011, which are incorporated herein by reference in their entirety. Furthermore, in accordance with one or more embodiments, infrared imaging module 100 and/or associated components may be implemented, calibrated, tested, and/or used in accordance with various techniques, such as for example as set forth in U.S. Pat. No. 7,470,902 issued Dec. 30, 2008, U.S. Pat. No. 6,028,309 issued Feb. 22, 2000, U.S. Pat. No.

6,812,465 issued Nov. 2, 2004, U.S. Pat. No. 7,034,301 issued Apr. 25, 2006, U.S. Pat. No. 7,679,048 issued Mar. 16, 2010, U.S. Pat. No. 7,470,904 issued Dec. 30, 2008, U.S. patent application Ser. No. 12/202,880 filed Sep. 2, 2008, and U.S. patent application Ser. No. 12/202,896 filed Sep. 2, 2008, which are incorporated herein by reference in their entirety.

Referring again to FIG. 1, in various embodiments, host device 102 may include shutter 105. In this regard, shutter 105 may be selectively positioned over socket 104 (e.g., as identified by arrows 103) while infrared imaging module 100 is installed therein. In this regard, shutter 105 may be used, for example, to protect infrared imaging module 100 when not in use. Shutter 105 may also be used as a temperature reference as part of a calibration process (e.g., a NUC process or other calibration processes) for infrared imaging module 100 as would be understood by one skilled in the art.

In various embodiments, shutter 105 may be made from various materials such as, for example, polymers, glass, aluminum (e.g., painted or anodized) or other materials. In various embodiments, shutter 105 may include one or more coatings to selectively filter electromagnetic radiation and/or adjust various optical properties of shutter 105 (e.g., a uniform blackbody coating or a reflective gold coating).

In another embodiment, shutter 105 may be fixed in place to protect infrared imaging module 100 at all times. In this case, shutter 105 or a portion of shutter 105 may be made from appropriate materials (e.g., polymers or infrared transmitting materials such as silicon, germanium, zinc selenide, or chalcogenide glasses) that do not substantially filter desired infrared wavelengths. In another embodiment, a shutter may be implemented as part of infrared imaging module 100 (e.g., within or as part of a lens barrel or other components of infrared imaging module 100), as would be understood by one skilled in the art.

Alternatively, in another embodiment, a shutter (e.g., shutter 105 or other type of external or internal shutter) need not be provided, but rather a NUC process or other type of calibration may be performed using shutterless techniques. In another embodiment, a NUC process or other type of calibration using shutterless techniques may be performed in combination with shutter-based techniques.

Infrared imaging module 100 and host device 102 may be implemented in accordance with any of the various techniques set forth in U.S. Provisional Patent Application No. 61/495,873 filed Jun. 10, 2011, U.S. Provisional Patent Application No. 61/495,879 filed Jun. 10, 2011, and U.S. Provisional Patent Application No. 61/495,888 filed Jun. 10, 2011, which are incorporated herein by reference in their entirety.

In various embodiments, the components of host device 102 and/or infrared imaging module 100 may be implemented as a local or distributed system with components in communication with each other over wired and/or wireless networks. Accordingly, the various operations identified in this disclosure may be performed by local and/or remote components as may be desired in particular implementations.

Figure 5:
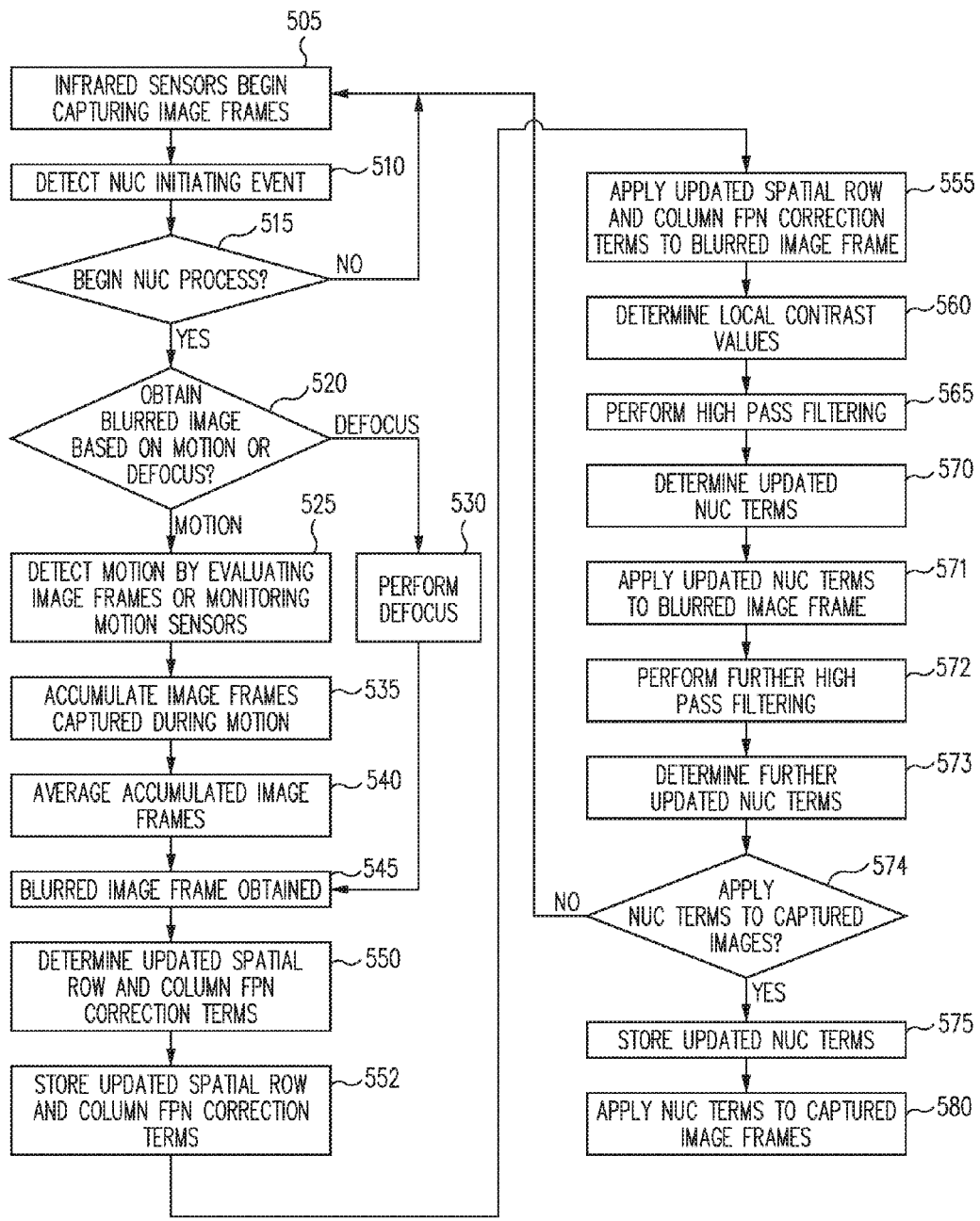
FIG. 5 illustrates a flow diagram of various operations to determine non-uniformity correction (NUC) terms in accordance with an embodiment of the disclosure.

FIG. 5 illustrates a flow diagram of various operations to determine NUC terms in accordance with an embodiment of the disclosure. In some embodiments, the operations of FIG. 5 may be performed by processing module 160 or processor 195 (both also generally referred to as a processor) operating on image frames captured by infrared sensors 132.

In block 505, infrared sensors 132 begin capturing image frames of a scene. Typically, the scene will be the real world environment in which host device 102 is currently located. In this regard, shutter 105 (if optionally provided) may be opened to permit infrared imaging module to receive infrared radiation from the scene. Infrared sensors 132 may continue capturing image frames during all operations shown in FIG. 5. In this regard, the continuously captured image frames may be used for various operations as further discussed. In one embodiment, the captured image frames may be temporally filtered (e.g., in accordance with the process of block 826 further described herein with regard to FIG. 8) and be processed by other terms (e.g., factory gain terms 812, factory offset terms 816, previously determined NUC terms 817, column FPN terms 820, and row FPN terms 824 as further described herein with regard to FIG. 8) before they are used in the operations shown in FIG. 5.

In block 510, a NUC process initiating event is detected. In one embodiment, the NUC process may be initiated in response to physical movement of host device 102. Such movement may be detected, for example, by motion sensors 194 which may be polled by a processor. In one example, a user may move host device 102 in a particular manner, such as by intentionally waving host device 102 back and forth in an "erase" or "swipe" movement. In this regard, the user may move host device 102 in accordance with a predetermined speed and direction (velocity), such as in an up and down, side to side, or other pattern to initiate the NUC process. In this example, the use of such movements may permit the user to intuitively operate host device 102 to simulate the "erasing" of noise in captured image frames.

In another example, a NUC process may be initiated by host device 102 if motion exceeding a threshold value is detected (e.g., motion greater than expected for ordinary use). It is contemplated that any desired type of spatial translation of host device 102 may be used to initiate the NUC process.

In yet another example, a NUC process may be initiated by host device 102 if a minimum time has elapsed since a previously performed NUC process. In a further example, a NUC process may be initiated by host device 102 if infrared imaging module 100 has experienced a minimum temperature change since a previously performed NUC process. In a still further example, a NUC process may be continuously initiated and repeated.

In block 515, after a NUC process initiating event is detected, it is determined whether the NUC process should actually be performed. In this regard, the NUC process may be selectively initiated based on whether one or more additional conditions are met. For example, in one embodiment, the NUC process may not be performed unless a minimum time has elapsed since a previously performed NUC process. In another embodiment, the NUC process may not be performed unless infrared imaging module 100 has experienced a minimum temperature change since a previously performed NUC process. Other criteria or conditions may be used in other embodiments. If appropriate criteria or conditions have been met, then the flow diagram continues to block 520. Otherwise, the flow diagram returns to block 505.

In the NUC process, blurred image frames may be used to determine NUC terms which may be applied to captured image frames to correct for FPN. As discussed, in one embodiment, the blurred image frames may be obtained by accumulating multiple image frames of a moving scene (e.g., captured while the scene and/or the thermal imager is in motion). In another embodiment, the blurred image frames may be obtained by defocusing an optical element or other component of the thermal imager.

Accordingly, in block 520 a choice of either approach is provided. If the motion-based approach is used, then the flow diagram continues to block 525. If the defocus-based approach is used, then the flow diagram continues to block 530.

Referring now to the motion-based approach, in block 525 motion is detected. For example, in one embodiment, motion may be detected based on the image frames captured by infrared sensors 132. In this regard, an appropriate motion detection process (e.g., an image registration process, a frame-to-frame difference calculation, or other appropriate process) may be applied to captured image frames to determine whether motion is present (e.g., whether static or moving image frames have been captured). For example, in one embodiment, it can be determined whether pixels or regions around the pixels of consecutive image frames have changed more than a user defined amount (e.g., a percentage and/or threshold value). If at least a given percentage of pixels have changed by at least the user defined amount, then motion will be detected with sufficient certainty to proceed to block 535.

In another embodiment, motion may be determined on a per pixel basis, wherein only pixels that exhibit significant changes are accumulated to provide the blurred image frame. For example, counters may be provided for each pixel and used to ensure that the same number of pixel values are accumulated for each pixel, or used to average the pixel values based on the number of pixel values actually accumulated for each pixel. Other types of image-based motion detection may be performed such as performing a Radon transform.

In another embodiment, motion may be detected based on data provided by motion sensors 194. In one embodiment, such motion detection may include detecting whether host device 102 is moving along a relatively straight trajectory through space. For example, if host device 102 is moving along a relatively straight trajectory, then it is possible that certain objects appearing in the imaged scene may not be sufficiently blurred (e.g., objects in the scene that may be aligned with or moving substantially parallel to the straight trajectory). Thus, in such an embodiment, the motion detected by motion sensors 194 may be conditioned on host device 102 exhibiting, or not exhibiting, particular trajectories.

In yet another embodiment, both a motion detection process and motion sensors 194 may be used. Thus, using any of these various embodiments, a determination can be made as to whether or not each image frame was captured while at least a portion of the scene and host device 102 were in motion relative to each other (e.g., which may be caused by host device 102 moving relative to the scene, at least a portion of the scene moving relative to host device 102, or both).

It is expected that the image frames for which motion was detected may exhibit some secondary blurring of the captured scene (e.g., blurred thermal image data associated with the scene) due to the thermal time constants of infrared sensors 132 (e.g., microbolometer thermal time constants) interacting with the scene movement.

In block 535, image frames for which motion was detected are accumulated. For example, if motion is detected for a continuous series of image frames, then the image frames of the series may be accumulated. As another example, if motion is detected for only some image frames, then the non-moving image frames may be skipped and not included in the accumulation. Thus, a continuous or discontinuous set of image frames may be selected to be accumulated based on the detected motion.

In block 540, the accumulated image frames are averaged to provide a blurred image frame. Because the accumulated image frames were captured during motion, it is expected that actual scene information will vary between the image frames and thus cause the scene information to be further blurred in the resulting blurred image frame (block 545).

In contrast, FPN (e.g., caused by one or more components of infrared imaging module 100) will remain fixed over at least short periods of time and over at least limited changes in scene irradiance during motion. As a result, image frames captured in close proximity in time and space during motion will suffer from identical or at least very similar FPN. Thus, although scene information may change in consecutive image frames, the FPN will stay essentially constant. By averaging, multiple image frames captured during motion will blur the scene information, but will not blur the FPN. As a result, FPN will remain more clearly defined in the blurred image frame provided in block 545 than the scene information.

In one embodiment, 32 or more image frames are accumulated and averaged in blocks 535 and 540. However, any desired number of image frames may be used in other embodiments, but with generally decreasing correction accuracy as frame count is decreased.

Referring now to the defocus-based approach, in block 530, a defocus operation may be performed to intentionally defocus the image frames captured by infrared sensors 132. For example, in one embodiment, one or more actuators 199 may be used to adjust, move, or otherwise translate optical element 180, infrared sensor assembly 128, and/or other components of infrared imaging module 100 to cause infrared sensors 132 to capture a blurred (e.g., unfocused) image frame of the scene. Other non-actuator based techniques are also contemplated for intentionally defocusing infrared image frames such as, for example, manual (e.g., user-initiated) defocusing.

Although the scene may appear blurred in the image frame, FPN (e.g., caused by one or more components of infrared imaging module 100) will remain unaffected by the defocusing operation. As a result, a blurred image frame of the scene will be provided (block 545) with FPN remaining more clearly defined in the blurred image than the scene information.

In the above discussion, the defocus-based approach has been described with regard to a single captured image frame. In another embodiment, the defocus-based approach may include accumulating multiple image frames while the infrared imaging module 100 has been defocused and averaging the defocused image frames to remove the effects of temporal noise and provide a blurred image frame in block 545.

Thus, it will be appreciated that a blurred image frame may be provided in block 545 by either the motion-based approach or the defocus-based approach. Because much of the scene information will be blurred by either motion, defocusing, or both, the blurred image frame may be effectively considered a low pass filtered version of the original captured image frames with respect to scene information.

In block 550, the blurred image frame is processed to determine updated row and column FPN terms (e.g., if row and column FPN terms have not been previously determined then the updated row and column FPN terms may be new row and column FPN terms in the first iteration of block 550). As used in this disclosure, the terms row and column may be used interchangeably depending on the orientation of infrared sensors 132 and/or other components of infrared imaging module 100.

In one embodiment, block 550 includes determining a spatial FPN correction term for each row of the blurred image frame (e.g., each row may have its own spatial FPN correction term), and also determining a spatial FPN correction term for each column of the blurred image frame (e.g., each column may have its own spatial FPN correction term). Such processing may be used to reduce the spatial and slowly varying (1/f) row and column FPN inherent in thermal imagers caused by, for example, 1/f noise characteristics of amplifiers in ROIC 402 which may manifest as vertical and horizontal stripes in image frames.

Advantageously, by determining spatial row and column FPN terms using the blurred image frame, there will be a reduced risk of vertical and horizontal objects in the actual imaged scene from being mistaken for row and column noise (e.g., real scene content will be blurred while FPN remains unblurred).

Figure 6:
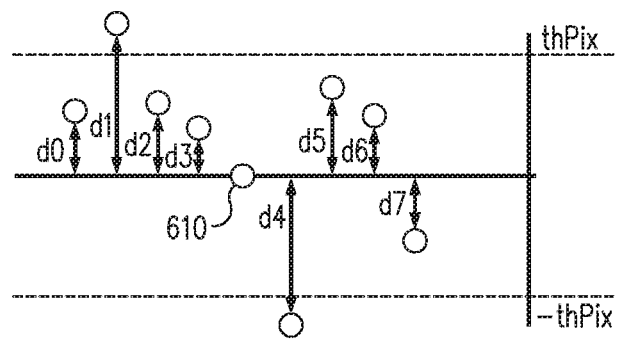
FIG. 6 illustrates differences between neighboring pixels in accordance with an embodiment of the disclosure.

In one embodiment, row and column FPN terms may be determined by considering differences between neighboring pixels of the blurred image frame. For example, FIG. 6 illustrates differences between neighboring pixels in accordance with an embodiment of the disclosure. Specifically, in FIG. 6 a pixel 610 is compared to its 8 nearest horizontal neighbors: d0-d3 on one side and d4-d7 on the other side. Differences between the neighbor pixels can be averaged to obtain an estimate of the offset error of the illustrated group of pixels. An offset error may be calculated for each pixel in a row or column and the average result may be used to correct the entire row or column.

To prevent real scene data from being interpreted as noise, upper and lower threshold values may be used (thPix and −thPix). Pixel values falling outside these threshold values (pixels d1 and d4 in this example) are not used to obtain the offset error. In addition, the maximum amount of row and column FPN correction may be limited by these threshold values.

Further techniques for performing spatial row and column FPN correction processing are set forth in U.S. patent application Ser. No. 12/396,340 filed Mar. 2, 2009 which is incorporated herein by reference in its entirety.

Referring again to FIG. 5, the updated row and column FPN terms determined in block 550 are stored (block 552) and applied (block 555) to the blurred image frame provided in block 545. After these terms are applied, some of the spatial row and column FPN in the blurred image frame may be reduced. However, because such terms are applied generally to rows and columns, additional FPN may remain such as spatially uncorrelated FPN associated with pixel to pixel drift or other causes. Neighborhoods of spatially correlated FPN may also remain which may not be directly associated with individual rows and columns. Accordingly, further processing may be performed as discussed below to determine NUC terms.

In block 560, local contrast values (e.g., edges or absolute values of gradients between adjacent or small groups of pixels) in the blurred image frame are determined. If scene information in the blurred image frame includes contrasting areas that have not been significantly blurred (e.g., high contrast edges in the original scene data), then such features may be identified by a contrast determination process in block 560.

For example, local contrast values in the blurred image frame may be calculated, or any other desired type of edge detection process may be applied to identify certain pixels in the blurred image as being part of an area of local contrast. Pixels that are marked in this manner may be considered as containing excessive high spatial frequency scene information that would be interpreted as FPN (e.g., such regions may correspond to portions of the scene that have not been sufficiently blurred). As such, these pixels may be excluded from being used in the further determination of NUC terms. In one embodiment, such contrast detection processing may rely on a threshold that is higher than the expected contrast value associated with FPN (e.g., pixels exhibiting a contrast value higher than the threshold may be considered to be scene information, and those lower than the threshold may be considered to be exhibiting FPN).

In one embodiment, the contrast determination of block 560 may be performed on the blurred image frame after row and column FPN terms have been applied to the blurred image frame (e.g., as shown in FIG. 5). In another embodiment, block 560 may be performed prior to block 550 to determine contrast before row and column FPN terms are determined (e.g., to prevent scene based contrast from contributing to the determination of such terms).

Following block 560, it is expected that any high spatial frequency content remaining in the blurred image frame may be generally attributed to spatially uncorrelated FPN. In this regard, following block 560, much of the other noise or actual desired scene based information has been removed or excluded from the blurred image frame due to: intentional blurring of the image frame (e.g., by motion or defocusing in blocks 520 through 545), application of row and column FPN terms (block 555), and contrast determination (block 560).

Thus, it can be expected that following block 560, any remaining high spatial frequency content (e.g., exhibited as areas of contrast or differences in the blurred image frame) may be attributed to spatially uncorrelated FPN. Accordingly, in block 565, the blurred image frame is high pass filtered. In one embodiment, this may include applying a high pass filter to extract the high spatial frequency content from the blurred image frame. In another embodiment, this may include applying a low pass filter to the blurred image frame and taking a difference between the low pass filtered image frame and the unfiltered blurred image frame to obtain the high spatial frequency content. In accordance with various embodiments of the present disclosure, a high pass filter may be implemented by calculating a mean difference between a sensor signal (e.g., a pixel value) and its neighbors.

In block 570, a flat field correction process is performed on the high pass filtered blurred image frame to determine updated NUC terms (e.g., if a NUC process has not previously been performed then the updated NUC terms may be new NUC terms in the first iteration of block 570).

Figure 7:
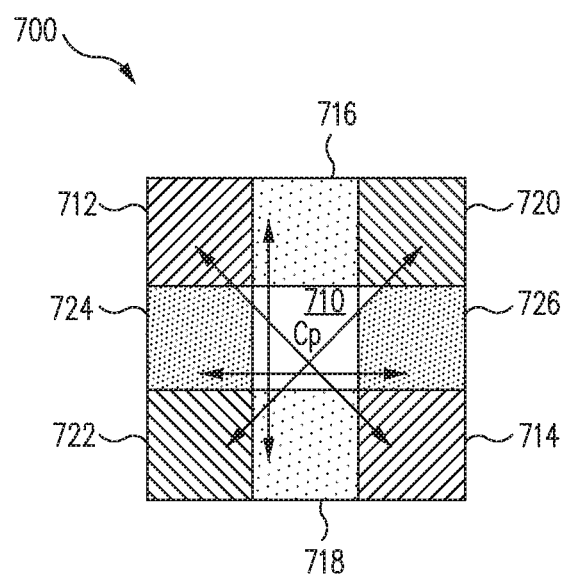
FIG. 7 illustrates a flat field correction technique in accordance with an embodiment of the disclosure.

For example, FIG. 7 illustrates a flat field correction technique 700 in accordance with an embodiment of the disclosure. In FIG. 7, a NUC term may be determined for each pixel 710 of the blurred image frame using the values of its neighboring pixels 712 to 726. For each pixel 710, several gradients may be determined based on the absolute difference between the values of various adjacent pixels. For example, absolute value differences may be determined between: pixels 712 and 714 (a left to right diagonal gradient), pixels 716 and 718 (a top to bottom vertical gradient), pixels 720 and 722 (a right to left diagonal gradient), and pixels 724 and 726 (a left to right horizontal gradient).

These absolute differences may be summed to provide a summed gradient for pixel 710. A weight value may be determined for pixel 710 that is inversely proportional to the summed gradient. This process may be performed for all pixels 710 of the blurred image frame until a weight value is provided for each pixel 710. For areas with low gradients (e.g., areas that are blurry or have low contrast), the weight value will be close to one. Conversely, for areas with high gradients, the weight value will be zero or close to zero. The update to the NUC term as estimated by the high pass filter is multiplied with the weight value.

In one embodiment, the risk of introducing scene information into the NUC terms can be further reduced by applying some amount of temporal damping to the NUC term determination process. For example, a temporal damping factor $\lambda$ between 0 and 1 may be chosen such that the new NUC term ($NUC_{NEW}$) stored is a weighted average of the old NUC term ($NUC_{OLD}$) and the estimated updated NUC term ($NUC_{UPDATE}$). In one embodiment, this can be expressed as $NUC_{NEW} = \lambda \cdot NUC_{OLD} + (1-\lambda) \cdot (NUC_{OLD} + NUC_{OLD} + NUC_{UPDATE})$.

Although the determination of NUC terms has been described with regard to gradients, local contrast values may be used instead where appropriate. Other techniques may also be used such as, for example, standard deviation calculations. Other types flat field correction processes may be performed to determine NUC terms including, for example, various processes identified in U.S. Pat. No. 6,028,309 issued Feb. 22, 2000, U.S. Pat. No. 6,812,465 issued Nov. 2, 2004, and U.S. patent application Ser. No. 12/114,865 filed May 5, 2008, which are incorporated herein by reference in their entirety.

Referring again to FIG. 5, block 570 may include additional processing of the NUC terms. For example, in one embodiment, to preserve the scene signal mean, the sum of all NUC terms may be normalized to zero by subtracting the NUC term mean from each NUC term. Also in block 570, to avoid row and column noise from affecting the NUC terms, the mean value of each row and column may be subtracted from the NUC terms for each row and column. As a result, row and column FPN filters using the row and column FPN terms determined in block 550 may be better able to filter out row and column noise in further iterations (e.g., as further shown in FIG. 8) after the NUC terms are applied to captured images (e.g., in block 580 further discussed herein). In this regard, the row and column FPN filters may in general use more data to calculate the per row and per column offset coefficients (e.g., row and column FPN terms) and may thus provide a more robust alternative for reducing spatially correlated FPN than the NUC terms which are based on high pass filtering to capture spatially uncorrelated noise.

In blocks 571-573, additional high pass filtering and further determinations of updated NUC terms may be optionally performed to remove spatially correlated FPN with lower spatial frequency than previously removed by row and column FPN terms. In this regard, some variability in infrared sensors 132 or other components of infrared imaging module 100 may result in spatially correlated FPN noise that cannot be easily modeled as row or column noise. Such spatially correlated FPN may include, for example, window defects on a sensor package or a cluster of infrared sensors 132 that respond differently to irradiance than neighboring infrared sensors 132. In one embodiment, such spatially correlated FPN may be mitigated with an offset correction. If the amount of such spatially correlated FPN is significant, then the noise may also be detectable in the blurred image frame. Since this type of noise may affect a neighborhood of pixels, a high pass filter with a small kernel may not detect the FPN in the neighborhood (e.g., all values used in high pass filter may be taken from the neighborhood of affected pixels and thus may be affected by the same offset error). For example, if the high pass filtering of block 565 is performed with a small kernel (e.g., considering only immediately adjacent pixels that fall within a neighborhood of pixels affected by spatially correlated FPN), then broadly distributed spatially correlated FPN may not be detected.

Figure 11:
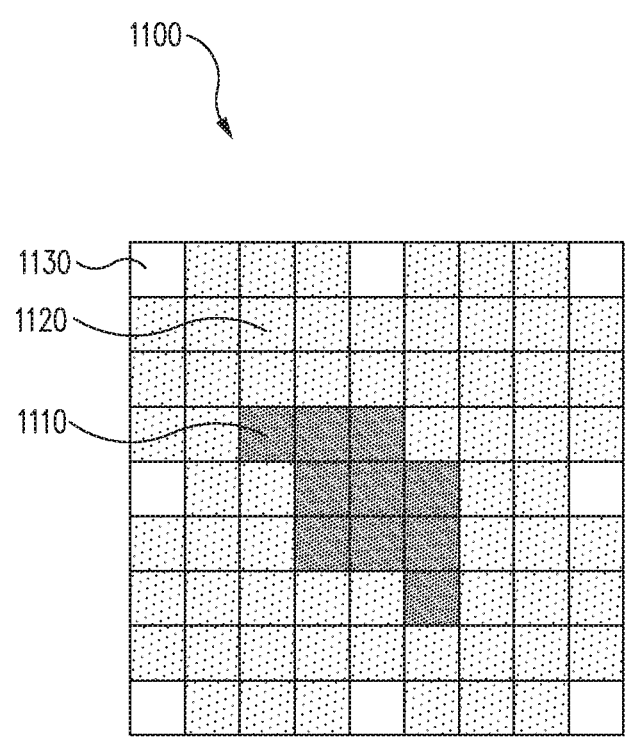
FIG. 11 illustrates spatially correlated fixed pattern noise (FPN) in a neighborhood of pixels in accordance with an embodiment of the disclosure.

For example, FIG. 11 illustrates spatially correlated FPN in a neighborhood of pixels in accordance with an embodiment of the disclosure. As shown in a sample image frame 1100, a neighborhood of pixels 1110 may exhibit spatially correlated FPN that is not precisely correlated to individual rows and columns and is distributed over a neighborhood of several pixels (e.g., a neighborhood of approximately 4 by 4 pixels in this example). Sample image frame 1100 also includes a set of pixels 1120 exhibiting substantially uniform response that are not used in filtering calculations, and a set of pixels 1130 that are used to estimate a low pass value for the neighborhood of pixels 1110. In one embodiment, pixels 1130 may be a number of pixels divisible by two in order to facilitate efficient hardware or software calculations.

Referring again to FIG. 5, in blocks 571-573, additional high pass filtering and further determinations of updated NUC terms may be optionally performed to remove spatially correlated FPN such as exhibited by pixels 1110. In block 571, the updated NUC terms determined in block 570 are applied to the blurred image frame. Thus, at this time, the blurred image frame will have been initially corrected for spatially correlated FPN (e.g., by application of the updated row and column FPN terms in block 555), and also initially corrected for spatially uncorrelated FPN (e.g., by application of the updated NUC terms applied in block 571).

In block 572, a further high pass filter is applied with a larger kernel than was used in block 565, and further updated NUC terms may be determined in block 573. For example, to detect the spatially correlated FPN present in pixels 1110, the high pass filter applied in block 572 may include data from a sufficiently large enough neighborhood of pixels such that differences can be determined between unaffected pixels (e.g., pixels 1120) and affected pixels (e.g., pixels 1110). For example, a low pass filter with a large kernel can be used (e.g., an N by N kernel that is much greater than 3 by 3 pixels) and the results may be subtracted to perform appropriate high pass filtering.

In one embodiment, for computational efficiency, a sparse kernel may be used such that only a small number of neighboring pixels inside an N by N neighborhood are used. For any given high pass filter operation using distant neighbors (e.g., a large kernel), there is a risk of modeling actual (potentially blurred) scene information as spatially correlated FPN. Accordingly, in one embodiment, the temporal damping factor $\lambda$ may be set close to 1 for updated NUC terms determined in block 573.

In various embodiments, blocks 571-573 may be repeated (e.g., cascaded) to iteratively perform high pass filtering with increasing kernel sizes to provide further updated NUC terms further correct for spatially correlated FPN of desired neighborhood sizes. In one embodiment, the decision to perform such iterations may be determined by whether spatially correlated FPN has actually been removed by the updated NUC terms of the previous performance of blocks 571-573.

After blocks 571-573 are finished, a decision is made regarding whether to apply the updated NUC terms to captured image frames (block 574). For example, if an average of the absolute value of the NUC terms for the entire image frame is less than a minimum threshold value; or greater than a maximum threshold value, the NUC terms may be deemed spurious or unlikely to provide meaningful correction. Alternatively, thresholding criteria may be applied to individual pixels to determine which pixels receive updated NUC terms. In one embodiment, the threshold values may correspond to differences between the newly calculated NUC terms and previously calculated NUC terms. In another embodiment, the threshold values may be independent of previously calculated NUC terms. Other tests may be applied (e.g., spatial correlation tests) to determine whether the NUC terms should be applied.

If the NUC terms are deemed spurious or unlikely to provide meaningful correction, then the flow diagram returns to block 505. Otherwise, the newly determined NUC terms are stored (block 575) to replace previous NUC terms (e.g., determined by a previously performed iteration of FIG. 5) and applied (block 580) to captured image frames.

Figure 8:
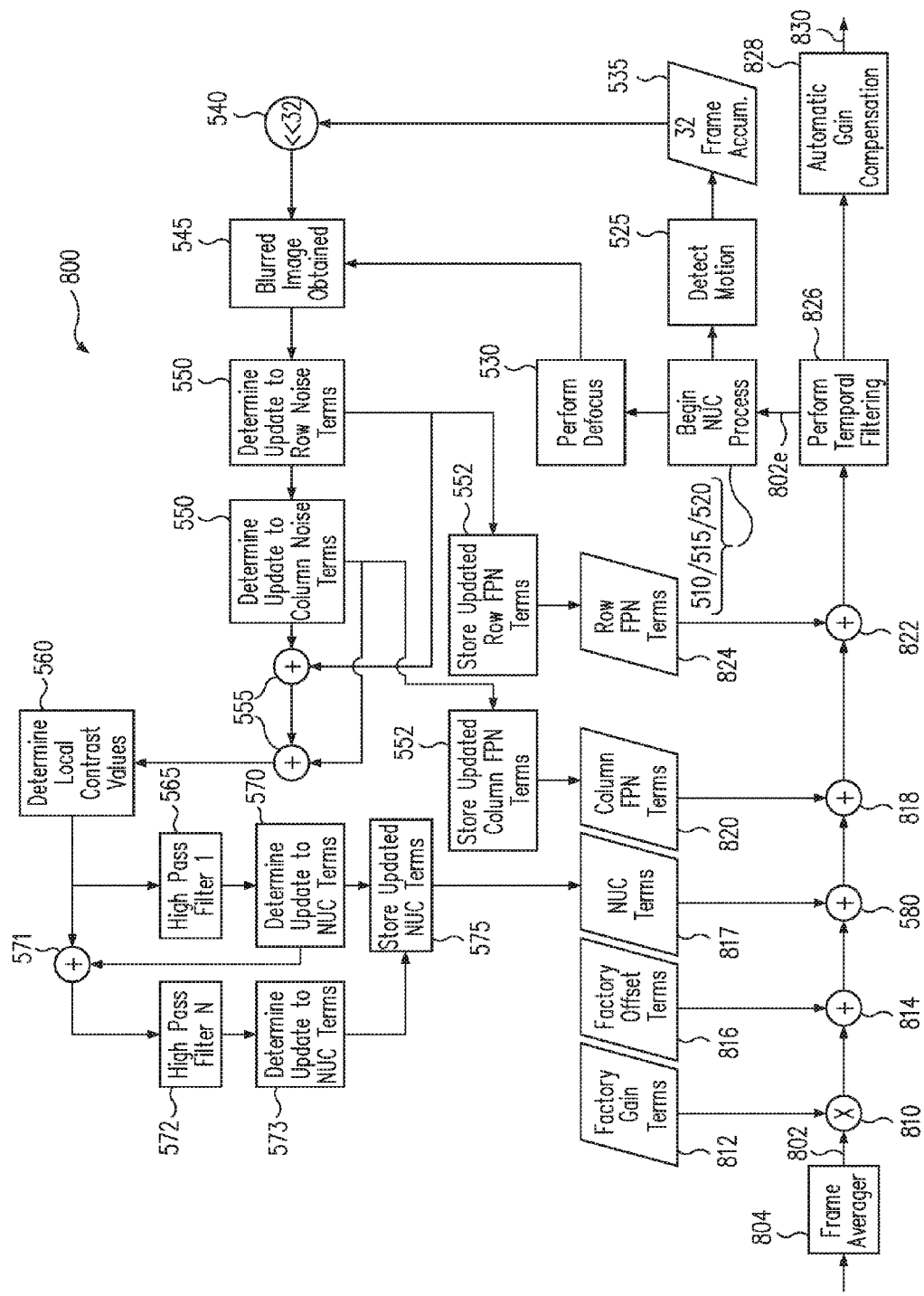
FIG. 8 illustrates various image processing techniques of FIG. 5 and other operations applied in an image processing pipeline in accordance with an embodiment of the disclosure.

FIG. 8 illustrates various image processing techniques of FIG. 5 and other operations applied in an image processing pipeline 800 in accordance with an embodiment of the disclosure. In this regard, pipeline 800 identifies various operations of FIG. 5 in the context of an overall iterative image processing scheme for correcting image frames provided by infrared imaging module 100. In some embodiments, pipeline 800 may be provided by processing module 160 or processor 195 (both also generally referred to as a processor) operating on image frames captured by infrared sensors 132.

Image frames captured by infrared sensors 132 may be provided to a frame averager 804 that integrates multiple image frames to provide image frames 802 with an improved signal to noise ratio. Frame averager 804 may be effectively provided by infrared sensors 132, ROIC 402, and other components of infrared sensor assembly 128 that are implemented to support high image capture rates. For example, in one embodiment, infrared sensor assembly 128 may capture infrared image frames at a frame rate of 240 Hz (e.g., 240 images per second). In this embodiment, such a high frame rate may be implemented, for example, by operating infrared sensor assembly 128 at relatively low voltages (e.g., compatible with mobile telephone voltages) and by using a relatively small array of infrared sensors 132 (e.g., an array of 64 by 64 infrared sensors in one embodiment).

In one embodiment, such infrared image frames may be provided from infrared sensor assembly 128 to processing module 160 at a high frame rate (e.g., 240 Hz or other frame rates). In another embodiment, infrared sensor assembly 128 may integrate over longer time periods, or multiple time periods, to provide integrated (e.g., averaged) infrared image frames to processing module 160 at a lower frame rate (e.g., 30 Hz, 9 Hz, or other frame rates). Further information regarding implementations that may be used to provide high image capture rates may be found in U.S. Provisional Patent Application No. 61/495,879 previously referenced herein.

Image frames 802 proceed through pipeline 800 where they are adjusted by various terms, temporally filtered, used to determine the various adjustment terms, and gain compensated.

In blocks 810 and 814, factory gain terms 812 and factory offset terms 816 are applied to image frames 802 to compensate for gain and offset differences, respectively, between the various infrared sensors 132 and/or other components of infrared imaging module 100 determined during manufacturing and testing.

In block 580, NUC terms 817 are applied to image frames 802 to correct for FPN as discussed. In one embodiment, if NUC terms 817 have not yet been determined (e.g., before a NUC process has been initiated), then block 580 may not be performed or initialization values may be used for NUC terms 817 that result in no alteration to the image data (e.g., offsets for every pixel would be equal to zero).

In blocks 818 and 822, column FPN terms 820 and row FPN terms 824, respectively, are applied to image frames 802. Column FPN terms 820 and row FPN terms 824 may be determined in accordance with block 550 as discussed. In one embodiment, if the column FPN terms 820 and row FPN terms 824 have not yet been determined (e.g., before a NUC process has been initiated), then blocks 818 and 822 may not be performed or initialization values may be used for the column FPN terms 820 and row FPN terms 824 that result in no alteration to the image data (e.g., offsets for every pixel would be equal to zero).

Figure 9:
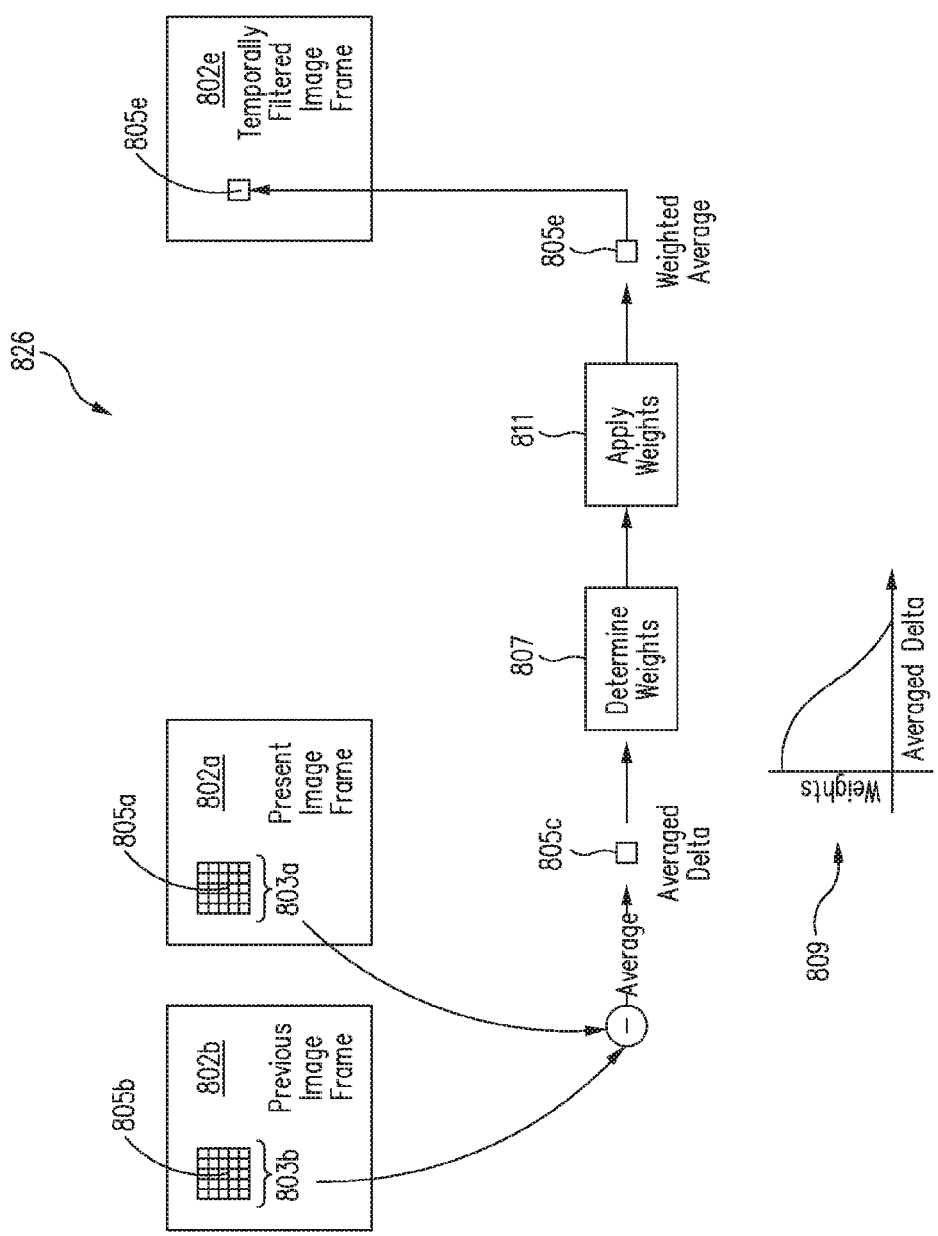
FIG. 9 illustrates a temporal noise reduction process in accordance with an embodiment of the disclosure.

In block 826, temporal filtering is performed on image frames 802 in accordance with a temporal noise reduction (TNR) process. FIG. 9 illustrates a TNR process in accordance with an embodiment of the disclosure. In FIG. 9, a presently received image frame 802a and a previously temporally filtered image frame 802b are processed to determine a new temporally filtered image frame 802e. Image frames 802a and 802b include local neighborhoods of pixels 803a and 803b centered around pixels 805a and 805b, respectively. Neighborhoods 803a and 803b correspond to the same locations within image frames 802a and 802b and are subsets of the total pixels in image frames 802a and 802b. In the illustrated embodiment, neighborhoods 803a and 803b include areas of 5 by 5 pixels. Other neighborhood sizes may be used in other embodiments.

Differences between corresponding pixels of neighborhoods 803a and 803b are determined and averaged to provide an averaged delta value 805c for the location corresponding to pixels 805a and 805b. Averaged delta value 805c may be used to determine weight values in block 807 to be applied to pixels 805a and 805b of image frames 802a and 802b.

In one embodiment, as shown in graph 809, the weight values determined in block 807 may be inversely proportional to averaged delta value 805c such that weight values drop rapidly towards zero when there are large differences between neighborhoods 803a and 803b. In this regard, large differences between neighborhoods 803a and 803b may indicate that changes have occurred within the scene (e.g., due to motion) and pixels 802a and 802b may be appropriately weighted, in one embodiment, to avoid introducing blur across frame-to-frame scene changes. Other associations between weight values and averaged delta value 805c may be used in various embodiments.

The weight values determined in block 807 may be applied to pixels 805a and 805b to determine a value for corresponding pixel 805e of image frame 802e (block 811). In this regard, pixel 805e may have a value that is a weighted average (or other combination) of pixels 805a and 805b, depending on averaged delta value 805c and the weight values determined in block 807.

For example, pixel 805e of temporally filtered image frame 802e may be a weighted sum of pixels 805a and 805b of image frames 802a and 802b. If the average difference between pixels 805a and 805b is due to noise, then it may be expected that the average change between neighborhoods 805a and 805b will be close to zero (e.g., corresponding to the average of uncorrelated changes). Under such circumstances, it may be expected that the sum of the differences between neighborhoods 805*a* and 805*b* will be close to zero. In this case, pixel 805*a* of image frame 802*a* may both be appropriately weighted so as to contribute to the value of pixel 805*e*.

However, if the sum of such differences is not zero (e.g., even differing from zero by a small amount in one embodiment), then the changes may be interpreted as being attributed to motion instead of noise. Thus, motion may be detected based on the average change exhibited by neighborhoods 805*a* and 805*b*. Under these circumstances, pixel 805*a* of image frame 802*a* may be weighted heavily, while pixel 805*b* of image frame 802*b* may be weighted lightly.

Other embodiments are also contemplated. For example, although averaged delta value 805*c* has been described as being determined based on neighborhoods 805*a* and 805*b*, in other embodiments averaged delta value 805*c* may be determined based on any desired criteria (e.g., based on individual pixels or other types of groups of sets of pixels).

In the above embodiments, image frame 802*a* has been described as a presently received image frame and image frame 802*b* has been described as a previously temporally filtered image frame. In another embodiment, image frames 802*a* and 802*b* may be first and second image frames captured by infrared imaging module 100 that have not been temporally filtered.

Figure 10:
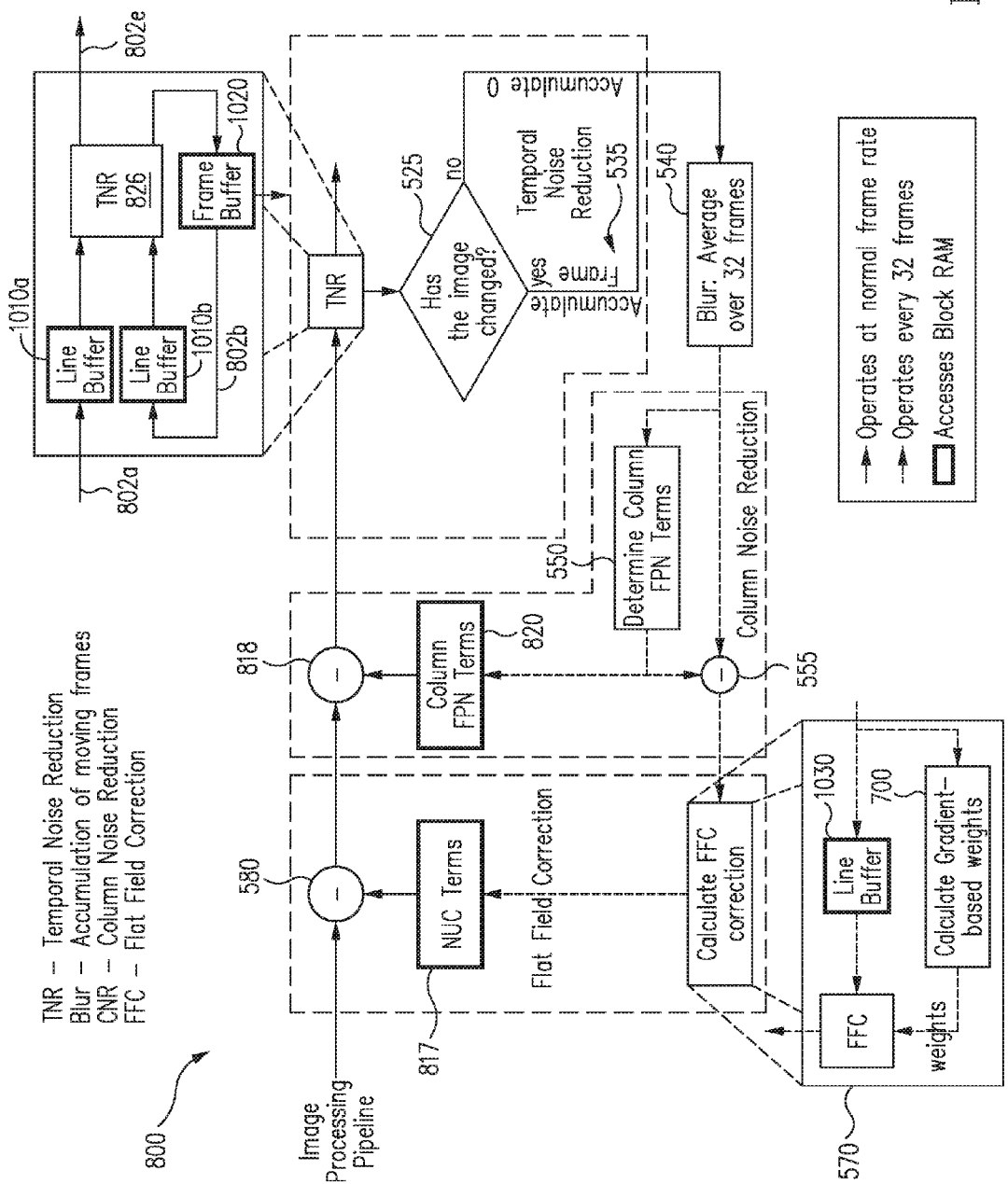
FIG. 10 illustrates particular implementation details of several processes of the image processing pipeline of FIG. 8 in accordance with an embodiment of the disclosure.

FIG. 10 illustrates further implementation details in relation to the TNR process of block 826. As shown in FIG. 10, image frames 802*a* and 802*b* may be read into line buffers 1010*a* and 1010*b*, respectively, and image frame 802*b* (e.g., the previous image frame) may be stored in a frame buffer 1020 before being read into line buffer 1010*b*. In one embodiment, line buffers 1010*a-b* and frame buffer 1020 may be implemented by a block of random access memory (RAM) provided by any appropriate component of infrared imaging module 100 and/or host device 102.

Referring again to FIG. 8, image frame 802*e* may be passed to an automatic gain compensation block 828 for further processing to provide a result image frame 830 that may be used by host device 102 as desired.

FIG. 8 further illustrates various operations that may be performed to determine row and column FPN terms and NUC terms as discussed. In one embodiment, these operations may use image frames 802*e* as shown in FIG. 8. Because image frames 802*e* have already been temporally filtered, at least some temporal noise may be removed and thus will not inadvertently affect the determination of row and column FPN terms 824 and 820 and NUC terms 817. In another embodiment, non-temporally filtered image frames 802 may be used.

In FIG. 8, blocks 510, 515, and 520 of FIG. 5 are collectively represented together. As discussed, a NUC process may be selectively initiated and performed in response to various NUC process initiating events and based on various criteria or conditions. As also discussed, the NUC process may be performed in accordance with a motion-based approach (blocks 525, 535, and 540) or a defocus-based approach (block 530) to provide a blurred image frame (block 545). FIG. 8 further illustrates various additional blocks 550, 552, 555, 560, 565, 570, 571, 572, 573, and 575 previously discussed with regard to FIG. 5.

As shown in FIG. 8, row and column FPN terms 824 and 820 and NUC terms 817 may be determined and applied in an iterative fashion such that updated terms are determined using image frames 802 to which previous terms have already been applied. As a result, the overall process of FIG. 8 may repeatedly update and apply such terms to continuously reduce the noise in image frames 830 to be used by host device 102.

Referring again to FIG. 10, further implementation details are illustrated for various blocks of FIGS. 5 and 8 in relation to pipeline 800. For example, blocks 525, 535, and 540 are shown as operating at the normal frame rate of image frames 802 received by pipeline 800. In the embodiment shown in FIG. 10, the determination made in block 525 is represented as a decision diamond used to determine whether a given image frame 802 has sufficiently changed such that it may be considered an image frame that will enhance the blur if added to other image frames and is therefore accumulated (block 535 is represented by an arrow in this embodiment) and averaged (block 540).

Also in FIG. 10, the determination of column FPN terms 820 (block 550) is shown as operating at an update rate that in this example is 1/32 of the sensor frame rate (e.g., normal frame rate) due to the averaging performed in block 540. Other update rates may be used in other embodiments. Although only column FPN terms 820 are identified in FIG. 10, row FPN terms 824 may be implemented in a similar fashion at the reduced frame rate.

FIG. 10 also illustrates further implementation details in relation to the NUC determination process of block 570. In this regard, the blurred image frame may be read to a line buffer 1030 (e.g., implemented by a block of RAM provided by any appropriate component of infrared imaging module 100 and/or host device 102). The flat field correction technique 700 of FIG. 7 may be performed on the blurred image frame.

In view of the present disclosure, it will be appreciated that techniques described herein may be used to remove various types of FPN (e.g., including very high amplitude FPN) such as spatially correlated row and column FPN and spatially uncorrelated FPN.

Other embodiments are also contemplated. For example, in one embodiment, the rate at which row and column FPN terms and/or NUC terms are updated can be inversely proportional to the estimated amount of blur in the blurred image frame and/or inversely proportional to the magnitude of local contrast values (e.g., determined in block 560).

In various embodiments, the described techniques may provide advantages over conventional shutter-based noise correction techniques. For example, by using a shutterless process, a shutter (e.g., such as shutter 105) need not be provided, thus permitting reductions in size, weight, cost, and mechanical complexity. Power and maximum voltage supplied to, or generated by, infrared imaging module 100 may also be reduced if a shutter does not need to be mechanically operated. Reliability will be improved by removing the shutter as a potential point of failure. A shutterless process also eliminates potential image interruption caused by the temporary blockage of the imaged scene by a shutter.

Also, by correcting for noise using intentionally blurred image frames captured from a real world scene (not a uniform scene provided by a shutter), noise correction may be performed on image frames that have irradiance levels similar to those of the actual scene desired to be imaged. This can improve the accuracy and effectiveness of noise correction terms determined in accordance with the various described techniques.

As discussed, in various embodiments, infrared imaging module 100 may be configured to operate at low voltage levels. In particular, infrared imaging module 100 may be implemented with circuitry configured to operate at low power and/or in accordance with other parameters that permit infrared imaging module 100 to be conveniently and effectively implemented in various types of host devices 102, such as mobile devices and other devices.

Figure 12:
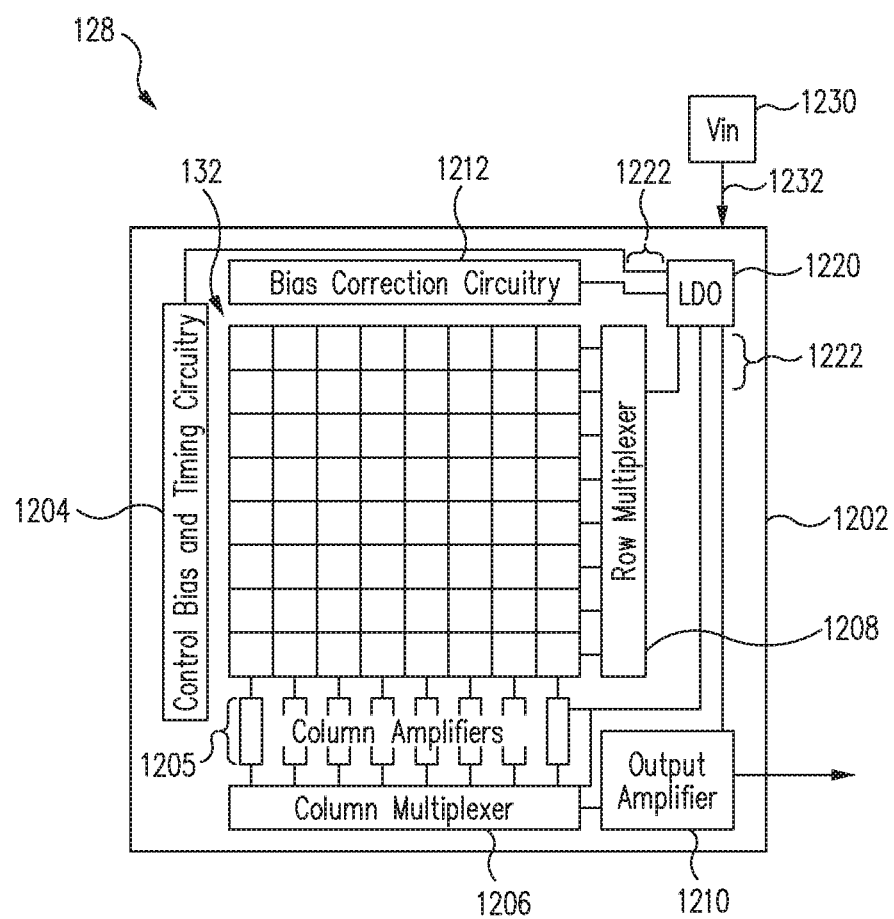
FIG. 12 illustrates a block diagram of another implementation of an infrared sensor assembly including an array of infrared sensors and a low-dropout regulator in accordance with an embodiment of the disclosure.

For example, FIG. 12 illustrates a block diagram of another implementation of infrared sensor assembly 128 including infrared sensors 132 and an LDO 1220 in accordance with an embodiment of the disclosure. As shown, FIG. 12 also illustrates various components 1202, 1204, 1205, 1206, 1208, and 1210 which may implemented in the same or similar manner as corresponding components previously described with regard to FIG. 4. FIG. 12 also illustrates bias correction circuitry 1212 which may be used to adjust one or more bias voltages provided to infrared sensors 132 (e.g., to compensate for temperature changes, self-heating, and/or other factors).

In some embodiments, LDO 1220 may be provided as part of infrared sensor assembly 128 (e.g., on the same chip and/or wafer level package as the ROIC). For example, LDO 1220 may be provided as part of an FPA with infrared sensor assembly 128. As discussed, such implementations may reduce power supply noise introduced to infrared sensor assembly 128 and thus provide an improved PSRR. In addition, by implementing the LDO with the ROIC, less die area may be consumed and fewer discrete die (or chips) are needed.

LDO 1220 receives an input voltage provided by a power source 1230 over a supply line 1232. LDO 1220 provides an output voltage to various components of infrared sensor assembly 128 over supply lines 1222. In this regard, LDO 1220 may provide substantially identical regulated output voltages to various components of infrared sensor assembly 128 in response to a single input voltage received from power source 1230.

For example, in some embodiments, power source 1230 may provide an input voltage in a range of approximately 2.8 volts to approximately 11 volts (e.g., approximately 2.8 volts in one embodiment), and LDO 1220 may provide an output voltage in a range of approximately 1.5 volts to approximately 2.8 volts (e.g., approximately 2.5 volts in one embodiment). In this regard, LDO 1220 may be used to provide a consistent regulated output voltage, regardless of whether power source 1230 is implemented with a conventional voltage range of approximately 9 volts to approximately 11 volts, or a low voltage such as approximately 2.8 volts. As such, although various voltage ranges are provided for the input and output voltages, it is contemplated that the output voltage of LDO 1220 will remain fixed despite changes in the input voltage.

The implementation of LDO 1220 as part of infrared sensor assembly 128 provides various advantages over conventional power implementations for FPAs. For example, conventional FPAs typically rely on multiple power sources, each of which may be provided separately to the FPA, and separately distributed to the various components of the FPA. By regulating a single power source 1230 by LDO 1220, appropriate voltages may be separately provided (e.g., to reduce possible noise) to all components of infrared sensor assembly 128 with reduced complexity. The use of LDO 1220 also allows infrared sensor assembly 128 to operate in a consistent manner, even if the input voltage from power source 1230 changes (e.g., if the input voltage increases or decreases as a result of charging or discharging a battery or other type of device used for power source 1230).

The various components of infrared sensor assembly 128 shown in FIG. 12 may also be implemented to operate at lower voltages than conventional devices. For example, as discussed, LDO 1220 may be implemented to provide a low voltage (e.g., approximately 2.5 volts). This contrasts with the multiple higher voltages typically used to power conventional FPAs, such as: approximately 3.3 volts to approximately 5 volts used to power digital circuitry; approximately 3.3 volts used to power analog circuitry; and approximately 9 volts to approximately 11 volts used to power loads. Also, in some embodiments, the use of LDO 1220 may reduce or eliminate the need for a separate negative reference voltage to be provided to infrared sensor assembly 128.

Figure 13:
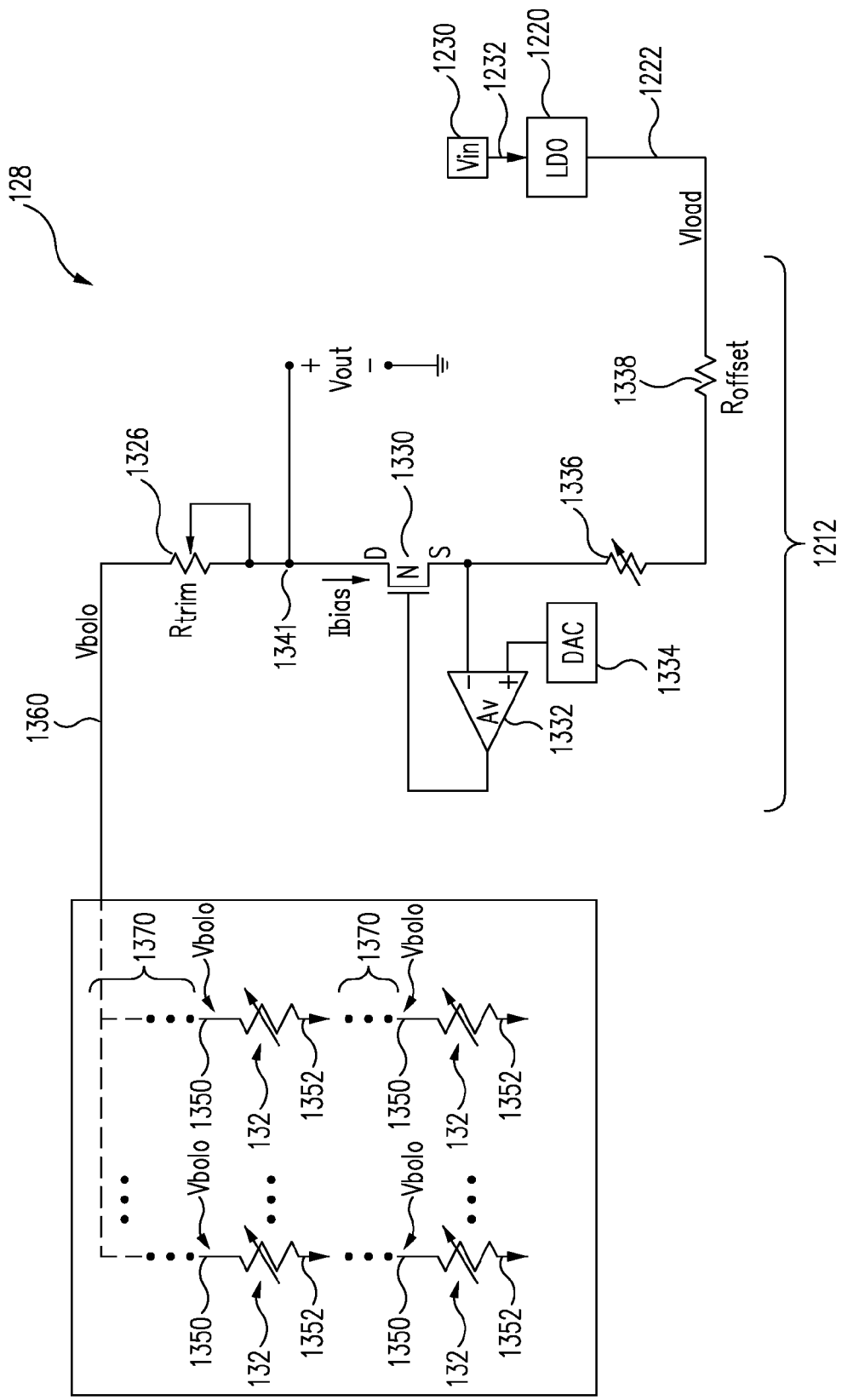
FIG. 13 illustrates a circuit diagram of a portion of the infrared sensor assembly of FIG. 12 in accordance with an embodiment of the disclosure.

Additional aspects of the low voltage operation of infrared sensor assembly 128 may be further understood with reference to FIG. 13. FIG. 13 illustrates a circuit diagram of a portion of infrared sensor assembly 128 of FIG. 12 in accordance with an embodiment of the disclosure. In particular, FIG. 13 illustrates additional components of bias correction circuitry 1212 (e.g., components 1326, 1330, 1332, 1334, 1336, 1338, and 1341) connected to LDO 1220 and infrared sensors 132. For example, bias correction circuitry 1212 may be used to compensate for temperature-dependent changes in bias voltages in accordance with an embodiment of the present disclosure. The operation of such additional components may be further understood with reference to similar components identified in U.S. Pat. No. 7,679,048 issued Mar. 16, 2010 which is hereby incorporated by reference in its entirety. Infrared sensor assembly 128 may also be implemented in accordance with the various components identified in U.S. Pat. No. 6,812,465 issued Nov. 2, 2004 which is hereby incorporated by reference in its entirety.

In various embodiments, some or all of the bias correction circuitry 1212 may be implemented on a global array basis as shown in FIG. 13 (e.g., used for all infrared sensors 132 collectively in an array). In other embodiments, some or all of the bias correction circuitry 1212 may be implemented an individual sensor basis (e.g., entirely or partially duplicated for each infrared sensor 132). In some embodiments, bias correction circuitry 1212 and other components of FIG. 13 may be implemented as part of ROIC 1202.

As shown in FIG. 13, LDO 1220 provides a load voltage Vload to bias correction circuitry 1212 along one of supply lines 1222. As discussed, in some embodiments, Vload may be approximately 2.5 volts which contrasts with larger voltages of approximately 9 volts to approximately 11 volts that may be used as load voltages in conventional infrared imaging devices.

Based on Vload, bias correction circuitry 1212 provides a sensor bias voltage Vbolo at a node 1360. Vbolo may be distributed to one or more infrared sensors 132 through appropriate switching circuitry 1370 (e.g., represented by broken lines in FIG. 13). In some examples, switching circuitry 1370 may be implemented in accordance with appropriate components identified in U.S. Pat. Nos. 6,812,465 and 7,679,048 previously referenced herein.

Each infrared sensor 132 includes a node 1350 which receives Vbolo through switching circuitry 1370, and another node 1352 which may be connected to ground, a substrate, and/or a negative reference voltage. In some embodiments, the voltage at node 1360 may be substantially the same as Vbolo provided at nodes 1350. In other embodiments, the voltage at node 1360 may be adjusted to compensate for possible voltage drops associated with switching circuitry 1370 and/or other factors.

Vbolo may be implemented with lower voltages than are typically used for conventional infrared sensor biasing. In one embodiment, Vbolo may be in a range of approximately 0.2 volts to approximately 0.7 volts. In another embodiment, Vbolo may be in a range of approximately 0.4 volts to approximately 0.6 volts. In another embodiment, Vbolo may be approximately 0.5 volts. In contrast, conventional infrared sensors typically use bias voltages of approximately 1 volt.

The use of a lower bias voltage for infrared sensors 132 in accordance with the present disclosure permits infrared sensor assembly 128 to exhibit significantly reduced power consumption in comparison with conventional infrared imaging devices. In particular, the power consumption of each infrared sensor 132 is reduced by the square of the bias voltage. As a result, a reduction from, for example, 1.0 volt to 0.5 volts provides a significant reduction in power, especially when applied to many infrared sensors 132 in an infrared sensor array. This reduction in power may also result in reduced self-heating of infrared sensor assembly 128.

In accordance with additional embodiments of the present disclosure, various techniques are provided for reducing the effects of noise in image frames provided by infrared imaging devices operating at low voltages. In this regard, when infrared sensor assembly 128 is operated with low voltages as described, noise, self-heating, and/or other phenomena may, if uncorrected, become more pronounced in image frames provided by infrared sensor assembly 128.

For example, referring to FIG. 13, when LDO 1220 maintains Vload at a low voltage in the manner described herein, Vbolo will also be maintained at its corresponding low voltage and the relative size of its output signals may be reduced. As a result, noise, self-heating, and/or other phenomena may have a greater effect on the smaller output signals read out from infrared sensors 132, resulting in variations (e.g., errors) in the output signals. If uncorrected, these variations may be exhibited as noise in the image frames. Moreover, although low voltage operation may reduce the overall amount of certain phenomena (e.g., self-heating), the smaller output signals may permit the remaining error sources (e.g., residual self-heating) to have a disproportionate effect on the output signals during low voltage operation.

To compensate for such phenomena, infrared sensor assembly 128, infrared imaging module 100, and/or host device 102 may be implemented with various array sizes, frame rates, and/or frame averaging techniques. For example, as discussed, a variety of different array sizes are contemplated for infrared sensors 132. In some embodiments, infrared sensors 132 may be implemented with array sizes ranging from 32 by 32 to 160 by 120 infrared sensors 132. Other example array sizes include 80 by 64, 80 by 60, 64 by 64, and 64 by 32. Any desired array size may be used.

Advantageously, when implemented with such relatively small array sizes, infrared sensor assembly 128 may provide image frames at relatively high frame rates without requiring significant changes to ROIC and related circuitry. For example, in some embodiments, frame rates may range from approximately 120 Hz to approximately 480 Hz.

In some embodiments, the array size and the frame rate may be scaled relative to each other (e.g., in an inversely proportional manner or otherwise) such that larger arrays are implemented with lower frame rates, and smaller arrays are implemented with higher frame rates. For example, in one embodiment, an array of 160 by 120 may provide a frame rate of approximately 120 Hz. In another embodiment, an array of 80 by 60 may provide a correspondingly higher frame rate of approximately 240 Hz. Other frame rates are also contemplated.

By scaling the array size and the frame rate relative to each other, the particular readout timing of rows and/or columns of the FPA may remain consistent, regardless of the actual FPA size or frame rate. In one embodiment, the readout timing may be approximately 63 microseconds per row or column.

As previously discussed with regard to FIG. 8, the image frames captured by infrared sensors 132 may be provided to a frame averager 804 that integrates multiple image frames to provide image frames 802 (e.g., processed image frames) with a lower frame rate (e.g., approximately 30 Hz, approximately 60 Hz, or other frame rates) and with an improved signal to noise ratio. In particular, by averaging the high frame rate image frames provided by a relatively small FPA, image noise attributable to low voltage operation may be effectively averaged out and/or substantially reduced in image frames 802. Accordingly, infrared sensor assembly 128 may be operated at relatively low voltages provided by LDO 1220 as discussed without experiencing additional noise and related side effects in the resulting image frames 802 after processing by frame averager 804.

Other embodiments are also contemplated. For example, although a single array of infrared sensors 132 is illustrated, it is contemplated that multiple such arrays may be used together to provide higher resolution image frames (e.g., a scene may be imaged across multiple such arrays). Such arrays may be provided in multiple infrared sensor assemblies 128 and/or provided in the same infrared sensor assembly 128. Each such array may be operated at low voltages as described, and also may be provided with associated ROIC circuitry such that each array may still be operated at a relatively high frame rate. The high frame rate image frames provided by such arrays may be averaged by shared or dedicated frame averagers 804 to reduce and/or eliminate noise associated with low voltage operation. As a result, high resolution infrared images may be obtained while still operating at low voltages.

In various embodiments, infrared sensor assembly 128 may be implemented with appropriate dimensions to permit infrared imaging module 100 to be used with a small form factor socket 104, such as a socket used for mobile devices. For example, in some embodiments, infrared sensor assembly 128 may be implemented with a die size in a range of approximately 4.0 mm by approximately 4.0 mm to approximately 5.5 mm by approximately 5.5 mm (e.g., approximately 4.0 mm by approximately 5.5 mm in one example). Infrared sensor assembly 128 may be implemented with such sizes or other appropriate sizes to permit use with socket 104 implemented with various sizes such as: 8.5 mm by 8.5 mm, 8.5 mm by 5.9 mm, 6.0 mm by 6.0 mm, 5.5 mm by 5.5 mm, 4.5 mm by 4.5 mm, and/or other socket sizes such as, for example, those identified in Table 1 of U.S. Provisional Patent Application No. 61/495,873 previously referenced herein.

Figure 14:
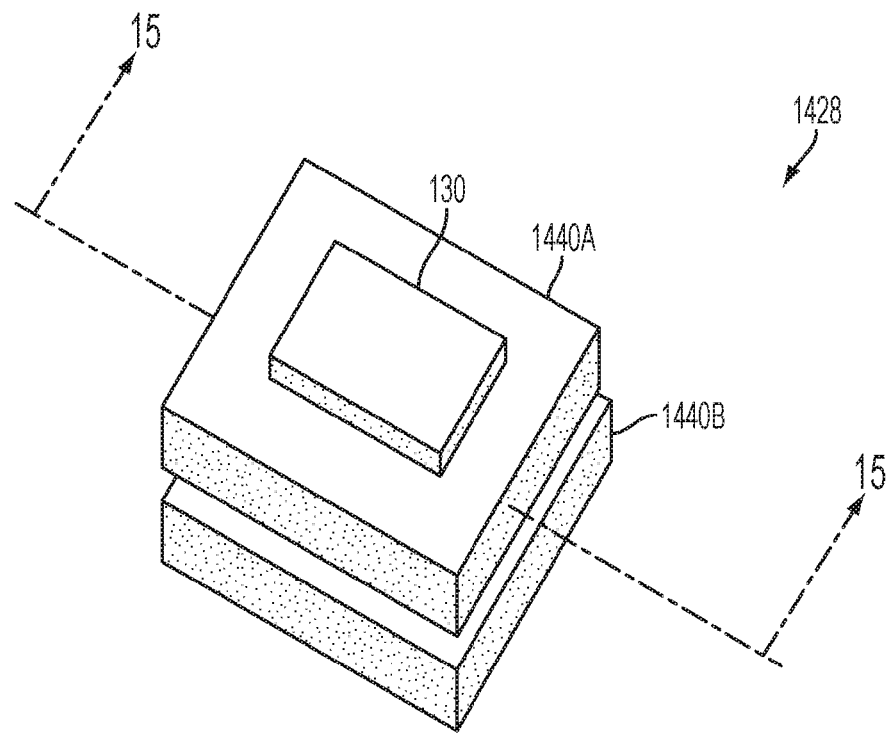
FIG. 14 illustrates a perspective view of a segmented focal plane array (FPA) implementing an infrared sensor assembly in accordance with an embodiment of the disclosure.
Figure 15:
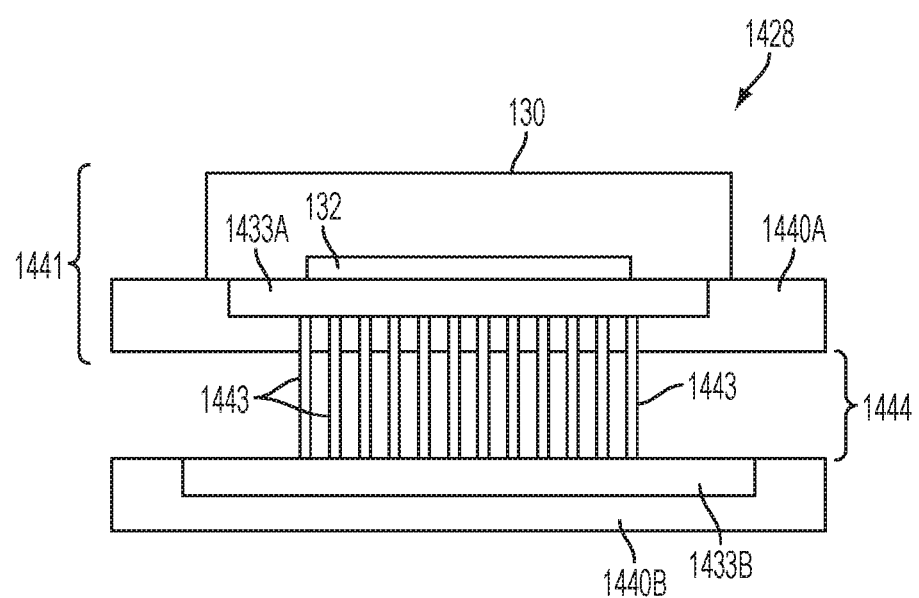
FIG. 15 illustrates a cross-sectional view along line 15-15 of the segmented FPA of FIG. 14 in accordance with an embodiment of the disclosure.

FIGS. 14 and 15 illustrate various views of another implementation of infrared sensor assembly 128 in accordance with an embodiment of the disclosure. More specifically, FIG. 14 illustrates a perspective view of a segmented FPA 1428 implementing infrared sensor assembly 128, and FIG. 15 illustrates a cross-sectional view along line 15-15 of segmented FPA 1428 in accordance with an embodiment of the disclosure.

In one or more embodiments, segmented FPA 1428 may include two or more dies or substrates (e.g., a die 1440A and a die 1440B) electrically coupled by a plurality of inter-die connections 1443. Although two dies are shown in the illustrated embodiment of FIGS. 14 and 15, it is contemplated for other embodiments that segmented FPA 1428 may include more than two dies as desired for particular applications of the disclosure. In general, various components of infrared sensor assembly 128, such as ROIC 402/1202 and an array of infrared sensors 132, may be distributed among the two or more dies of segmented FPA 1428, with inter-die connections 1443 providing signal paths or other electrical paths between components on different dies where needed.

For example, die 1440A may include an array of infrared sensors 132 (e.g., an array of bolometers) as described above with respect to FIGS. 3 and 4. Die 1440A may further include circuitry 1433A electrically coupled to the array of infrared sensors 132. In some embodiments, circuitry 1433A may include some portion of ROIC 402/1202 described herein, with some or all of the remainder of ROIC 402/1202 being included in circuitry 1433B fabricated on die 1440B. In some embodiments, substantially all of ROIC 402/1202 is included in circuitry 1433B on die 1440B. In some embodiments, circuitry 1433A may include circuits or components that are adapted to obtain and/or generate some form of intermediate signals (e.g., detected signals, analog signals, and/or digital signals) from infrared sensors 132, whereas circuitry 1433B may include circuits or components that are adapted to facilitate generation of output values (e.g., infrared image data) to be output from segmented FPA 1428 based on the intermediate signals. In some embodiments, circuitry 1433A may include all or substantially all components or circuits that are associated with analog operations of ROIC 402/1202, whereas circuitry 1433B may include components or circuits associated with digital operations.

As such, circuitry 1433A and circuitry 1433B may each be less complex than a conventional ROIC provided on a single die (e.g., having circuits and components of circuitry 1433A and 1433B combined). Such a segmented implementation may in many cases permit a higher yield for die 1440A and 1440B compared with the yield of a conventional single-die FPA. In addition, since the segmented implementation may permit circuitry 1433A and 1433B to be designed separately, circuitry 1433A and/or 1433B may be redesigned or updated without affecting the design of the other as long as the interface between the two via inter-die connections 1443 is kept. As such, the segmented implementation of infrared sensor assembly 128 may in some cases permit a reduction in design costs when infrared sensor assembly 128 needs design updates or changes.

In one specific example, circuitry 1433A may include all or part of bias correction circuitry 1212, switching circuitry 1370, and/or other circuitry associated with FPA unit cells to facilitate generation of analog output signals associated with infrared sensors 132, whereas circuitry 1433B may include some or all of the remainder of ROIC 402/1202 to facilitate generation of multiplexed digital output signals providing digital values from infrared sensor assembly 128 based on the analog output signals. In other examples, circuitry 1433A may further include all or part of control and timing circuitry 404/1204, column amplifiers 405/1205, column multiplexer 406/1206, row multiplexer 408/1208, output amplifier 410/1210, and/or analog-to-digital converters (ADCs).

In various embodiments, inter-die connections 1443 may be configured to pass analog and/or digital electrical signals (e.g., any signal associated with various operations to generate output values corresponding to infrared radiation received at segmented FPA 1428, including voltage and/or current supplies) between circuitry 1433A and circuitry 1433B where needed. Thus, for various embodiments, die 1440A and die 1440B of segmented FPA 1428 can be fabricated separately, then stacked and bonded together (e.g., by wafer-to-wafer, wafer-to-die, or die-to-die bonding), with inter-die connections 1443 providing necessary signal paths or other electrical paths. As such, segmented FPA 1428 may exhibit a smaller footprint (e.g., a smaller two-dimensional size) compared with conventional FPAs having a similarly sized bolometer array and an ROIC with similar functionalities but implemented in a single die.

Moreover, since die 1440A and die 1440B may be fabricated separately, they may be fabricated using different semiconductor fabrication processes. For example, die 1440A may be fabricated using a semiconductor fabrication process that may be more suitable for electrically sensing signals associated with bolometers, while die 1440B may be fabricated using a tighter fabrication process (e.g., having a narrower wire pitch) suitable for a denser integration of other circuits and components. In this regard, for some embodiments the fabrication process for die 1440A be optimized for electrical components (e.g., transistors, resistors, capacitors and/or other components) that may accommodate large voltage swings and/or low noise, while the fabrication process for die 1440B may be optimized for digital circuitry that may have lower power usage and/or higher density but is less suited for sensing analog signals (e.g., has higher noise and/or lower voltage swing capacity). In one example implementation, die 1440A may be fabricated using a 350 nm CMOS process, while die 1440B may be fabricated using a 45 nm CMOS process. As may be appreciated, a more suitable fabrication process for each die may in some cases permit a further reduction in the overall footprint of segmented FPA 1428, as well as an improved yield for each die.

Various suitable methods may be utilized to implement inter-die connections 1443. For example, in some embodiments, inter-die connections 1443 may include through-silicon vias (TSVs) that pass completely or partially through die 1440A and/or die 1440B. Such TSVs may be formed, fabricated, or otherwise provided using various conventional methods, and may be electrically connected to appropriate wires (e.g., wires transmitting desired electrical signals, voltage, and/or current as further identified herein) on circuitry 1433A or circuitry 1433B. In some embodiments, inter-die connections 1443 (e.g., including TSVs) may include micro-bumps or other suitable contact structures to facilitate alignment, engagement, and/or bonding of the dies. In some embodiments, a bonding material (e.g., an adhesive suitable for wafer bonding) may be provided in a gap 1444 between die 1440A and die 1440B to facilitate and/or secure bonding of die 1440A and die 1440B.

In various embodiments, the array of infrared sensors 132 (e.g., an array of bolometers) on die 1440A may be sealed or otherwise covered by cap 130. For example, in some embodiments, die 1440A and cap 130 may form a vacuum package assembly (VPA) 1441 that vacuum-seals the array of infrared sensors 132. In one embodiment, VPA 1441 may be implemented as a wafer level package (WLP), using various wafer level packaging techniques discussed above with respect to FIGS. 3 and 4. The footprint of die 1440A may be adjusted by including more or less of ROIC 402/1202 in circuitry 1433A, if desired for particular implementation of VPA 1441.

Figure 16:
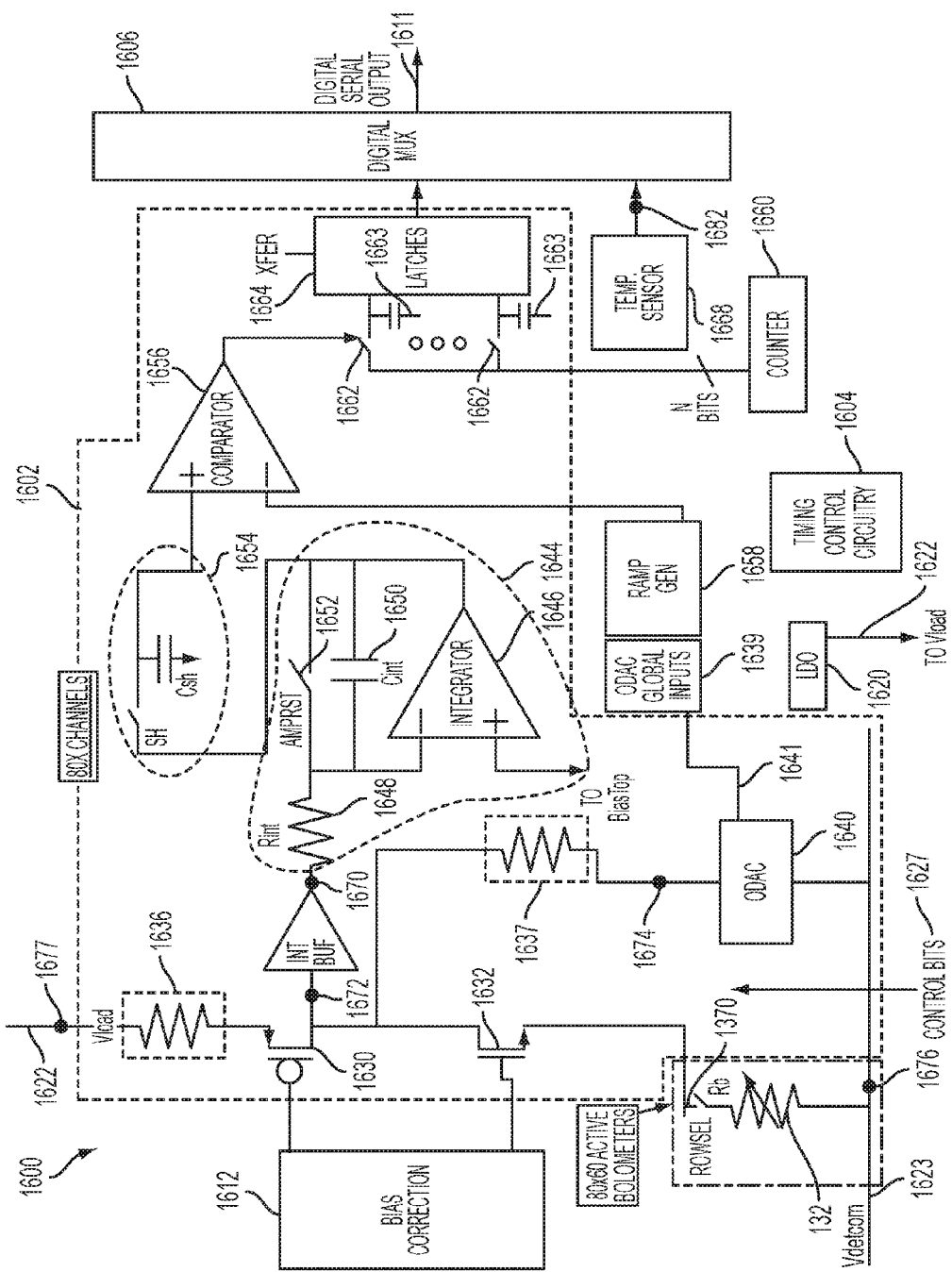
FIG. 16 illustrates a schematic diagram of a circuit of an infrared sensor assembly in accordance with an embodiment of the disclosure.

As discussed above, the present disclosure contemplates various ways of partitioning and/or distributing various components and circuits of an ROIC between die 1440A and die 1440B. Such various ways of partitioning and/or distributing may be better understood with reference to FIG. 16. FIG. 16 illustrates a schematic diagram of a circuit 1600 of infrared sensor assembly 128, in accordance with an embodiment of the disclosure. It should be understood, however, that techniques disclosed herein are not limited to circuit 1600, but rather are applicable to various implementations of FPA circuits (e.g., including bolometers, unit cell circuits, and ROICs). For example, any one of the various implementations of FPA circuits described in U.S. Pat. Nos. 6,028,309, 6,812,465, 7,034,301, and 7,679,048 previously referenced herein may be appropriately partitioned and/or distributed to implement segmented FPA 1428, as would be understood by one skilled in the art.

Circuit 1600 may include a channel circuitry portion 1602, which may in turn include a plurality of per-channel (or per-column) blocks, for example, one per-channel block for each column of the array of infrared sensors 132. That is, for example, the components and circuits shown encircled as channel circuitry portion 1602 may be repeated and included for each column of the array as a per-channel block. In the illustrated embodiment of FIG. 16, eighty of such per-channel blocks are indicated in channel circuitry portion 1602. However, as discussed herein, the array of infrared sensors 132 may be of any size as desired for particular implementations, and hence the number of per-channel blocks in channel circuitry portion 1602 may vary for different implementations. Also, in yet other implementations, some components or circuits shown in channel circuitry portion 1602 may instead be shared by two or more columns of the array of infrared sensors 132 or by the entire array of infrared sensors 132 (e.g., one such component or circuit for the entire FPA). It should be appreciated that various techniques disclosed herein may be applied to such other implementations of circuit 1600 without departing from the scope and spirit of the disclosure.

Circuit 1600 may include infrared sensors 132 and switching circuitry 1370 in accordance with one or more embodiments as described herein and more specifically with respect to FIG. 13. In various embodiments, infrared sensors 132 may include active bolometers (labeled Rb and indicated by a bolometer symbol in FIG. 16) arranged in an array and adapted to receive infrared radiation attributable to a scene viewed by infrared sensor assembly 128 (e.g., by segmented FPA 1428). In the illustrated embodiment, an 80-by-60 array of active bolometers is indicated, which corresponds to sixty rows of active bolometers per each of the eighty per-channel blocks in channel circuitry portion 1602. The rows of active bolometers may be selected by switching circuitry 1370 as described above with respect to FIG. 13.

Infrared sensors 132 may be biased by a reference voltage (labeled Vdetcom) supplied by circuit paths 1623. In some embodiments, circuit 1600 may include bias correction circuitry 1612, which may be implemented in a similar manner as bias correction circuitry 1212 described above with respect to FIGS. 12 and 13, or in any other suitable manner to adjust one or more bias voltages provided to infrared sensors 132 (e.g., to compensate for temperature changes, self-heating, and/or other variations). For example, depending on specific implementations, bias correction circuitry 1612 may appropriately bias the gates of one or more transistors (e.g., transistors 1630 and 1632 in the illustrated circuit 1600) to adjust the bias voltage applied to infrared sensors 132. In this regard, circuit 1600 in some embodiments may include one or more bolometers (e.g., bolometers 1636 and 1637) thermally shorted (or shunted) to a substrate (e.g., substrate 140) to act as temperature-compensated loads that may aid in compensating the bias voltage for substrate temperature variations. In some embodiments, bias correction circuitry 1612 may also include one or more thermally shorted bolometers (not shown).

In various embodiments, the bias voltage provided using bias correction circuitry 1612, transistors 1630/1632, and/or thermally shorted bolometers 1636/1637 may be based on a load voltage (labeled Vload) supplied by a LDO 1620 through circuit paths 1622. In some embodiments, LDO 1620 may be implemented in a same or similar manner as LDO 1220 of FIGS. 12 and 13. In some embodiments, circuit 1600 may also include an offset digital-to-analog converter (DAC) 1640 adapted to vary the voltage and/or current in response to control bits 1641, and to provide offset correction. Control bits 1641 may be determined and stored, for example, in a memory 1639 of infrared sensor assembly 128 (e.g., segmented FPA 1428) during a calibration procedure performed in accordance with various processes described in U.S. Pat. Nos. 6,028,309 and 6,812,465 previously referred herein or other suitable calibration processes. In some embodiments, additional control bits 1627 may be utilized and provided to circuit 1600 to adjust various operating parameters associated with various components.

In terms of the general operation of circuit 1600, temperature changes experienced by an infrared sensor 132 (e.g., an active bolometer of a selected row for a given column) changes its resistance, and thus resulting in a change in an output voltage (e.g., at a node 1672 in the illustrated embodiment of FIG. 16). As described above, various components and/or circuits may be included in one or more embodiments to compensate for such temperature changes, self-heating, various mismatches, non-uniformities, and/or other variations.

A detected signal provided by an infrared sensor 132 (e.g., the output voltage at node 1672) may be buffered and/or amplified by a buffer 1642, according to some embodiments. The detected signal (e.g., amplified by buffer 1642 in some embodiments) may be integrated by an integrator 1644 to provide an analog signal. In some embodiments, integrator 1644 may be implemented using an op-amp 1646, a resistor 1648 (labeled Rint), a capacitor 1650 (labeled Cint), and a reset switch 1652. While one example implementation of integrator 1644 is shown in FIG. 16, any other suitable integrator or integrating circuitry may be utilized to implement integrator 1644.

In some embodiments, circuit 1600 may include a sample-and-hold circuit 1654 adapted to receive the analog signal (e.g., integrated detected signal) from integrator 1644. Sample-and-hold circuit 1654 may be utilized to capture (e.g., sample) a voltage in response to the analog signal, hold (e.g., maintain at a substantially constant level) the captured voltage, and provide the captured voltage for analog-to-digital conversion.

In various embodiments, circuit 1600 may include a comparator 1656, a ramp generator 1658, a counter 1660 (e.g., a digital counter in some embodiments), switches 1662, capacitors 1663, and latches 1664, which may be utilized to convert the captured voltage (e.g., the voltage held by sample-and-hold circuit 1654 in some embodiments) into a digital output value (e.g., by performing a ramp-compare analog-to-digital conversion). For example, ramp generator 1658 may be adapted to generate a ramp signal, and counter 1660 may be adapted to increment (or decrement depending on the implementation of counter 1660) a count value (e.g., encoded in one or more count signals) in response to receiving a clock signal. The count value incremented or decremented by digital counter 1660 may have a substantially similar period (e.g., resets to zero or a base value at substantially the same time) as the ramp signal. In this example, comparator 1656 may be adapted to receive the voltage from sample-and-hold circuit 1654 and the ramp signal from ramp generator 1658, and to compare the voltage and the ramp signal to trigger (e.g., generate a signal to close switches 1662) when the ramp signal substantially matches the voltage. When comparator 1656 triggers, the current count value may be selected and stored in latches 1664 as a digital value. In some embodiments, circuit 1600 may include a multiplexer 1606, which may be utilized to multiplex the digital values stored in latches 1664 for each channel/column to generate a digital output signal 1611 (e.g., a serial digital output signal including digital output values corresponding to the IR radiation received at infrared sensors 132).

Although in FIG. 16, comparator 1656, switches 1662, and latches 1664 are shown as being included in channel circuitry portion 1602 and repeated for each column, these components may be implemented outside channel circuitry 1602 on a global array basis (e.g., shared by all infrared sensors 132 or by infrared sensors 132 in a group of columns) in other embodiments. Also, in other embodiments, circuit 1600 may alternatively include other analog-to-digital converter implementations suitable for converting the voltage from sample-and-hold circuit 1654 to a digital value.

In some embodiments, circuit 1600 may include a temperature sensor 1668 adapted to obtain an ambient temperature reading associated with infrared sensor assembly 128. Such an ambient temperature reading may be utilized in performing various calibration processes. In one embodiment, temperature sensor 1668 and multiplexer 1606 may be adapted to multiplex the ambient temperature reading into digital output signal 1611, so that the ambient temperature reading may be accessed by components external to infrared sensor assembly 128 (e.g., by processing module 160 and/or processor 195 described herein). In various embodiments, circuit 1600 may include timing control circuitry 1604 implemented in a similar manner as the timing control portion of bias generation and timing control circuitry 404/1204. Timing control circuitry 1604 may be adapted to control and synchronize operations of various components of circuit 1600.

Various ways of partitioning and/or distributing various components and circuits of an ROIC between die 1440A and die 1440B of FIGS. 14 and 15 will now be described with respect to circuit 1600. In general, die 1440A may include infrared sensors 132 and switching circuitry 1370, in accordance with various embodiments of the disclosure.

In some embodiments, die 1440A may further include components involved in generating a detected signal (e.g., the output voltage at node 1672) resulting from the response of infrared sensors 132 (e.g., active bolometers) to incident infrared radiation. For example, in one embodiment, die 1440A may include, per each channel, one or more transistors (e.g., transistors 1630 and/or 1632) adapted to vary the bias voltage to infrared sensors 132 in response to bias correction signals from bias correction circuitry 1612. In one embodiment, die 1440A may further include bolometers (e.g., thermally shorted bolometers 1636 and/or 1637) thermally shorted to die 1440A and adapted to act as temperature-compensated loads that may aid in compensating the bias voltage for substrate temperature variations. Bias correction circuitry 1612 may also be included in die 1440A in some embodiments, for example, if bias correction circuitry 1612 includes thermally shorted bolometers that act as temperature-compensated loads tracking the temperature variation of infrared sensors 132 (e.g., active bolometers). In one embodiment, die 1440A may further include temperature sensor 1668 that may be utilized to obtain a temperature reading associated with die 1440A. The obtained temperature reading may be used, for example, to perform various temperature-dependent compensation and calibration operations. In one embodiment, temperature sensor 1668 may be disposed in close proximity to infrared sensors 132, thermally shorted bolometer 1636, and/or thermally shorted bolometer 1637, so that the temperature reading obtained by temperature sensor 1668 may closely track the temperature of these components.

In these embodiments, the detected signal resulting from the response of infrared sensors 132 may be passed or transmitted to appropriate nodes of the remainder of circuit 1600 via inter-die connections 1443. For example, inter-die connections 1443 may be adapted to electrically couple circuit 1600 at a node 1670, transmitting the detected signal (e.g., buffered, amplified, and/or otherwise) from buffer 1642 on die 1440A to integrator 1644 on die 1440B. By providing buffer 1642 on die 1440A and transmitting the detected signal over inter-die connections 1443, signal loss (e.g., due to parasitic capacitance and/or resistance) over inter-die connections 1443 may be reduced while still keeping the size of die 1440A small in some cases. Alternatively in another example, inter-die connections 1443 may be adapted to electrically couple circuit 1600 at node 1672, transmitting the detected signal at node 1672 from die 1440A to buffer 1642 provided on die 1440B. By providing buffer 1642 on die 1440B, the size of die 1440A may be further reduced in some implementations.

Also in these embodiments, inter-die connections 1443 may be adapted to electrically couple circuit 1600 at a node 1674, where the offset corrected voltage may be supplied from offset DAC 1640 provided on die 1440B. Other nodes which may be electrically coupled using inter-die connections 1443 may include, for example, a node 1677 to supply the load voltage Vload from die 1440B (e.g., generated by LDO 1620 on die 1440B) via inter-die connections 1443, a node 1676 to supply the reference voltage Vdetcom from die 1440B via inter-die connections 1443 if needed (e.g., if Vdetcom is not available directly from die 1440A), and/or a node 1682 to transmit the temperature reading obtained using temperature sensor 1668 to multiplexer 1606 on die 1440B. Also, in some embodiments, all or part of control bits 1627 may be transmitted from die 1440B to die 1440A via inter-die connections 1443. In some embodiments, inter-die connections 1443 electrically coupling die 1440A and die 1440B at node 1670, 1672, and/or 1674 may be provided on a per-channel basis, whereas inter-die connections 1443 at node 1676, 1677, and/or 1682 may be provided globally or otherwise shared by channel circuitry portion 1602. It is also contemplated that voltages, currents, and/or other signals to be transmitted via inter-die connections 1443 may be multiplexed or otherwise share one or more of inter-die connections 1443 to reduce the number of inter-die connections 1443, if desired for particular applications of segmented FPA 1428.

In another embodiment, die 1440A may include integrator 1644, and inter-die connections 1443 may be adapted to electrically couple circuit 1600 at a node 1678, transmitting the analog signal from integrator 1644 on die 1440A to sample-and-hold circuit 1654 on die 1440B. Thus, in such an embodiment, all or substantially all analog processing performed by infrared sensor assembly 128 may be performed on die 1440A. Although the size of die 1440A may be increased in some cases if integrator 1644 is provided on die 1440A, transmitting the integrated output via inter-die connections 1443 may in some cases further reduce signal loss that may be due to inter-die connections 1443.

In yet another set of embodiments, die 1440A may include the array of infrared sensors 132, associated switching circuitry 1370, and channel circuitry portion 1602, with inter-die connections 1443 adapted to transmit appropriate signals from global (e.g., used for all columns/channels collectively) components provided on die 1440B. For example, in one embodiment, die 1440B may include LDO 1620 and ramp generator 1658, with inter-die connections 1443 electrically coupling die 1440A and die 1440B at node 1677 to transmit the load voltage from LDO 1620 and at a node 1680 to transmit the ramp signal to comparator 1656. In another example, die 1440B may further include bias correction circuitry 1612, counter 1660, timing control circuitry 1604, and/or other global components, with inter-die connections 1443 further adapted to transmit appropriate signals to die 1440A. Since infrared sensors 132 and channel circuitry portion 1602 may be kept together on die 1440A, these embodiments may reduce the number of inter-die connections 1443 by reducing or eliminating per-channel connections.

Figure 17:
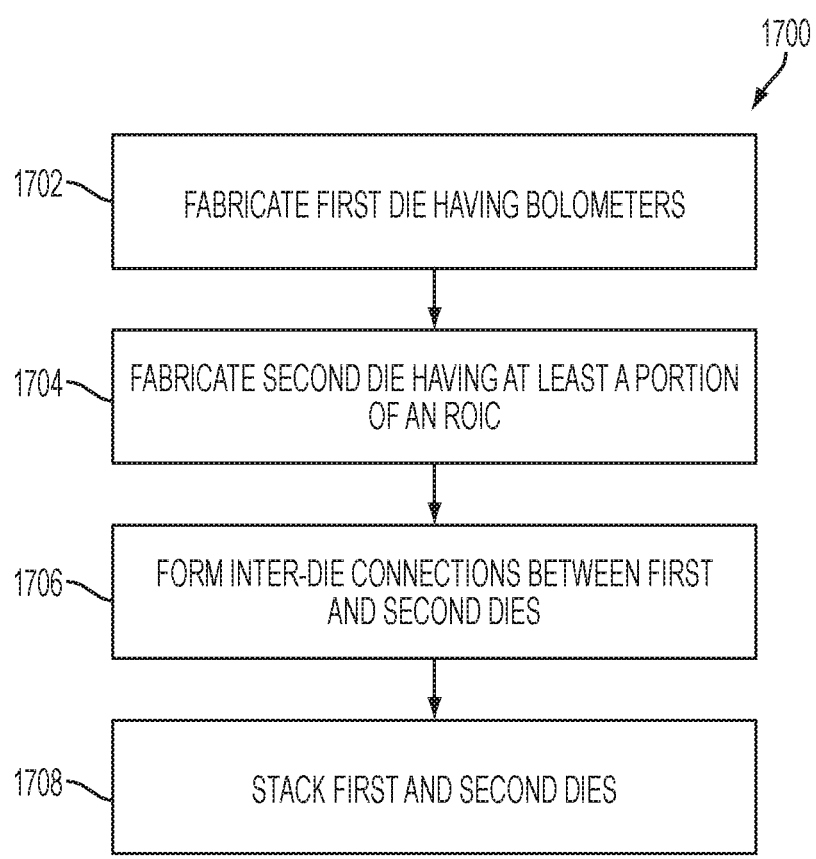
FIG. 17 illustrates a flowchart of a process to manufacture a segmented FPA in accordance with an embodiment of the disclosure.

Referring now to FIG. 17, a process 1700 to manufacture a segmented FPA is illustrated in accordance with an embodiment of the disclosure. For example, all or part of process 1700 may be utilized to manufacture or otherwise provide segmented FPA 1428 described herein. At block 1702, bolometers may be fabricated on a first die (e.g., a first substrate). For example, the array of infrared sensors 132 and associated switching circuitry 1370 may be fabricated on die 1440A as described herein. The fabrication may be performed utilizing a semiconductor fabrication process that is suitable for fabrication of bolometers as well as any associated circuitry, as would be understood by one skilled in the art. In some embodiments, the fabrication process may involve thinning down at least one side (e.g., the back side) of the wafer containing the first die in preparation for forming inter-die connections further described herein. In some embodiments, the fabrication process may include vacuum-sealing the array of infrared sensors 132 using cap 130 to provide VPA 1441. Further, in some embodiments, various wafer level packaging techniques discussed above with respect to FIGS. 3 and 4 may be utilized at block 1702 to implement VPA 1441 as a WLP.

At block 1704, a second die (e.g., die 1440B) may be fabricated to include at least a portion of an ROIC (e.g., a portion of circuit 1600). As discussed above for segmented FPA 1428, various components and circuits of an ROIC may be partitioned and/or distributed between the first die and the second die. In various embodiments, the fabrication of the first die at block 1702 and the fabrication of the second die at block 1704 may include fabricating components and/or circuits identified respectively for each die in accordance with the various ways of partitioning and/or distributing described for various embodiments of segmented FPA 1428 with respect to FIGS. 14-16.

Thus, for example, in one set of embodiments, the first die may be fabricated at block 1702 to include, in addition to infrared sensors 132 (e.g., active bolometers) and switching circuitry 1370, transistors 1630, 1632, thermally shorted bolometers 1636, 1637, bias correction circuitry 1612, and/or buffer 1642, while the second die may be fabricated at block 1704 to include all or part of the remaining portion of circuit 1600. In another set of embodiments, the first die may be fabricated to further include integrator 1644 instead of fabricating it on the second die. In yet another set of embodiments, the first die may be fabricated to include the array of infrared sensors 132, associated switching circuitry 1370, and channel circuitry portion 1602, while the second die may be fabricated to include LDO 1620, ramp generator 1658, bias correction circuitry 1612, counter 1660, timing control circuitry 1604, and/or other global components.

In some embodiments, the fabrication process for the second die may involve thinning down at least one side of the wafer containing the second die in preparation for forming inter-die connections further described herein. Also, in various embodiments, the fabrication of the second die may utilize a semiconductor fabrication process that is different from that of the first die. For example, as described above with respect to FIGS. 14 and 15, the second die may be fabricated using a semiconductor process that is tighter (e.g., having a narrower wire pitch) than that of the first die and/or using a semiconductor process that includes different silicon and/or metal composition from the first die, so as to achieve denser and/or more reliable integration of circuits and components.

At block 1706, inter-die connections 1443 may be formed or otherwise provided. In various embodiments, operations of block 1706 may involve forming, etching, micromachining and/or otherwise fabricating TSVs or other electrical paths or connections on the first and/or the second die. In some embodiments, operations of block 1706 may further include forming, micromachining, etching and/or otherwise fabricating micro-bumps and/or other suitable contact structures on the first and/or the second die. Inter-die connections 1443 may be formed to electrically couple the first and the second die where identified in accordance with the various ways of partitioning and/or distributing components between the first and the second die described for various embodiments of segmented FPA 1428. Some of the procedures of block 1706 may be performed during the fabrication of the first die at block 1702 and/or the fabrication of second die at blocks 1704 where appropriate.

At block 1708, the first and second dies may be stacked relative to each other to form segmented FPA 1428. For example, the first die may be translated to a position above the second die and/or the second die may be translated to a position below the first die. The stacking at block 1708 may be performed on a wafer-to-wafer, die-to-wafer, or die-to-die basis, as desired for particular application of process 1700. In some embodiments, procedures of block 1708 may include aligning the first and second dies relative to each other, engaging or forming appropriate contact structures of inter-die connections, and/or bonding the first and the second die together. In one embodiment, the bonding of the first and the second dies may involve applying or otherwise providing a bonding material (e.g., an adhesive suitable for bonding wafers) and curing the bonding material. Depending on the procedure(s) involved, some or all procedures of block 1708 may be performed before or during the procedures described for block 1706.

As discussed above, it is also contemplated that one or more additional dies may be fabricated to include at least a portion of an ROIC, and may be stacked in between the first and the second dies, above the first die, and/or below the second die, after forming appropriate inter-die connections. As also discussed above, by performing process 1700 to manufacture segmented FPA 1428, the yield of each die, as well as the overall yield (e.g., accounting for defects in inter-die connections) in some cases, may be higher compared with that for a single-die FPA. Further, due to the reduction in footprint, a larger number of dies may be fabricated on a similar-sized wafer, and thus may lead to further yield improvement and cost savings.

Figure 18:
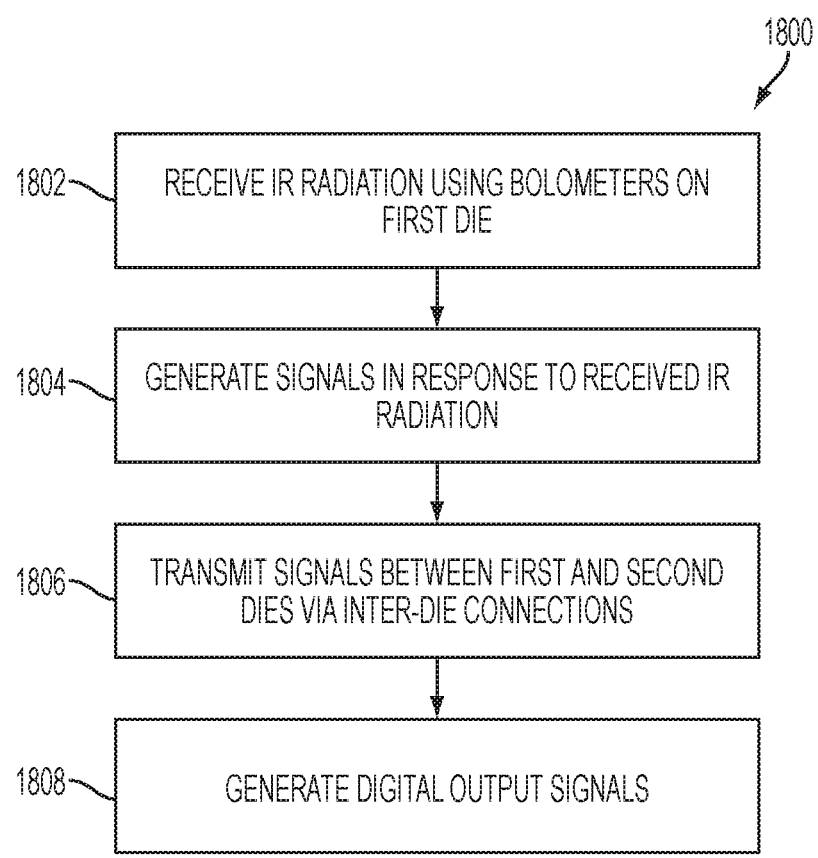
FIG. 18 illustrates a flowchart of a process to capture infrared image data using a segmented FPA in accordance with an embodiment of the disclosure.

FIG. 18 illustrates a process 1800 to capture infrared image data using a segmented FPA, in accordance with an embodiment of the disclosure. For example, various operations of process 1800 may be performed by one or more embodiments of segmented FPA 1428 described above, or by any other suitable infrared sensor assembly. At block 1802, infrared radiation from a scene may be received at infrared sensors 132 provided on die 1440A. As described herein, the infrared radiation may be appropriately routed and/or focused onto infrared sensors 132 (e.g., active bolometers) via optical element 180 and/or other appropriate components. Infrared sensors 132 (e.g., active bolometers) may then change one or more electrical properties (e.g., the resistance of the active bolometers) in response to the incident infrared radiation, as described above with respect to circuit 1600.

At block 1804, one or more intermediate signals (e.g., detected signals at nodes 1670 or 1672, analog signals at node 1678, and/or others) may be generated based on the resulting response (e.g., change in the resistance) of infrared sensors 132, using components and/or circuits provided on die 1440A according to one or more embodiments of segmented FPA 1428.

At block 1806, one or more signals may be transmitted (e.g., passed) via inter-die connections 1443 between dies 1440A and 1440B. For example, in some embodiments, such signals may be transmitted via inter-die connections 1443 from die 1440A to die 1440B using one or more of the various nodes (e.g., nodes 1670, 1672, and/or 1678) according to various embodiments of FPA 1428 described above. In some embodiments, the transmission may involve multiplexing or otherwise sharing one or more of inter-die connections 1443. In some embodiments, various signals (e.g., including the reference voltage Vdetcom, the load voltage Vload from LDO 1620, the ramp signal from ramp generator 1658, and/or other signals) may be transmitted from die 14403 to die 1440A using inter-die connections 1443 in block 1806.

At block 1808, one or more digital output signals 1611 may be generated as discussed using one or more of the signals transmitted between dies 1440A and 1440B. For example, as described above with respect to FIGS. 14-16, the intermediate signals received via inter-die connections 1443 may be converted into digital output values using sample-and-hold circuit 1654, comparator 1656, ramp generator 1658, digital counter 1660, switches 1662, and/or latches 1664 provided on die 1440B, according to one or more embodiments of segmented FPA 1428. In some embodiments, other suitable analog-to-digital converters may be utilized. In one embodiment, the received intermediate signals may be integrated using integrator 1644 provided on die 1440B prior to being converted into a digital output value. The generation of digital output signal 1611 may further include, according to some embodiments, multiplexing the digital output values stored in latches 1664 for each channel/column to generate a serial digital output signal 1611, for example, using multiplexer 1606.

Where applicable, various embodiments provided by the present disclosure can be implemented using hardware, software, or combinations of hardware and software. Also where applicable, the various hardware components and/or software components set forth herein can be combined into composite components comprising software, hardware, and/or both without departing from the spirit of the present disclosure. Where applicable, the various hardware components and/or software components set forth herein can be separated into sub-components comprising software, hardware, or both without departing from the spirit of the present disclosure. In addition, where applicable, it is contemplated that software components can be implemented as hardware components, and vice-versa.

Software in accordance with the present disclosure, such as non-transitory instructions, program code, and/or data, can be stored on one or more non-transitory machine readable mediums. It is also contemplated that software identified herein can be implemented using one or more general purpose or specific purpose computers and/or computer systems, networked and/or otherwise. Where applicable, the ordering of various steps described herein can be changed, combined into composite steps, and/or separated into sub-steps to provide features described herein.

Embodiments described above illustrate but do not limit the invention. It should also be understood that numerous modifications and variations are possible in accordance with the principles of the invention. Accordingly, the scope of the invention is defined only by the following claims.

What is claimed is:

1. A system comprising:
a focal plane array (FPA) comprising:
a first die comprising an array of active bolometers adapted to receive infrared (IR) radiation from a scene and a selected portion of a read-out integrated circuit (ROIC) for the array of active bolometers, the selected portion of the ROIC comprising analog circuitry configured to provide analog signals in response to the IR radiation received by the array of active bolometers;
a second die comprising a remainder of the ROIC for the array of active bolometers such that components of the ROIC are distributed between the first and the second die, the first die stacked on top of the second die to expose the array of active bolometers for receiving the IR radiation;
a plurality of inter-die connections adapted to pass signals between the first die and the second die, wherein the passed signals are used to generate output values corresponding to the IR radiation received at the array of active bolometers; and
a bias correction circuit implemented on the first die and a low-dropout regulator (LDO) implemented on the second die and configured to provide a regulated voltage to the bias correction circuit via one or more of the plurality of inter-die connections, wherein the bias correction circuit is configured to provide the bias voltage to the array of active bolometers in response to the regulated voltage from the LDO.

2. The system of claim 1, wherein:
the analog circuitry of the selected portion of the ROIC on the first die comprises one or more amplifiers;
the FPA comprises a cap adapted to seal at least a portion of the first die; and
the first die and the cap form a vacuum package assembly (VPA).

3. The system of claim 2, wherein:
the one or more amplifiers implement one or more integrators adapted to integrate detected signals from the array of active bolometers to provide the analog signals;
the passed signals comprise the analog signals provided by the one or more integrators and passed from the first die to the second die through at least one of the inter-die connections; and
the remainder of the ROIC on the second die comprises one or more an analog-to-digital converters (ADCs)

adapted to provide at least one of the output values in response to the analog signals.

4. The system of claim 1, wherein the selected portion of the ROIC on the first die comprises a temperature sensor adapted to obtain a temperature reading associated with the first die.

5. The system of claim 1, wherein the inter-die connections comprise through-silicon vias (TSVs) and/or microbumps.

6. The system of claim 1, wherein the first die is fabricated using a first fabrication process optimized for high power and/or low noise components and the second die is fabricated using a second fabrication process optimized for digital circuitry to accommodate lower power usage and/or higher density than the first fabrication process.

7. The system of claim 1, further comprising the bias voltage being selected from a range of approximately 0.2 volts to approximately 0.7 volts.

8. The system of claim 7, wherein the LDO is configured to provide the regulated voltage selected from a range of approximately 1.5 volts to approximately 2.8 volts.

9. A method comprising:
fabricating a first die comprising an array of active bolometers adapted to receive infrared (IR) radiation from a scene and a selected portion of a read-out integrated circuit (ROIC) for the array of active bolometers, the selected portion of the ROIC comprising analog circuitry configured to provide analog signals in response to the IR radiation received by the array of active bolometers;
fabricating a second die comprising a remainder of the ROIC for the array of active bolometers such that components of the ROIC are distributed between the first and the second die;
forming a plurality of inter-die connections adapted to pass signals between the first die and the second die, wherein the passed signals are used to generate output values corresponding to the IR radiation received at the array of active bolometers;
stacking the first die on top of the second die to expose the array of active bolometers for receiving the IR radiation;
wherein the first die, the second die, and the inter-die connections are part of a focal plane array (FPA);
the fabricating of the first die comprises implementing, on the first die, a bias correction circuit configured to provide a bias voltage to the array of active bolometers;
the fabricating of the second dies comprises implementing, on the second die, a low-dropout regulator (LDO) configured to provide a regulated voltage to the bias correction circuit via one or more of the plurality of inter-die connections; and
the bias correction circuit is configured to provide the bias voltage to the array of active bolometers in response to the regulated voltage from the LDO.

10. The method of claim 9, further comprising sealing at least a portion of the first die by a cap, wherein:
the analog circuitry of the selected portion of the ROIC on the first die comprises one or more amplifiers; and
the first die and the cap form a vacuum package assembly (VPA).

11. The method of claim 10, wherein:
the one or more amplifiers implement one or more integrators adapted to integrate detected signals from the array of active bolometers to provide the analog signals;
the passed signals comprise the analog signals provided by the one or more integrators and passed from the first die to the second die through at least one of the inter-die connections; and
the remainder of the ROIC on the second die comprises one or more analog-to-digital converters (ADCs) adapted to provide at least one of the output values in response to the analog signals.

12. The method of claim 9, wherein the selected portion of the ROIC on the first die comprises a temperature sensor adapted to obtain a temperature reading associated with the first die.

13. The method of claim 9, wherein the inter-die connections comprise through-silicon vias (TSVs) and/or microbumps.

14. The method of claim 9, wherein:
the fabricating the first die is performed using a first semiconductor fabrication process optimized for high power and/or low noise components; and
the fabricating the second die is performed using a second semiconductor fabrication process optimized for digital circuitry to accommodate lower power usage and/or higher density than the first fabrication process.

15. The method of claim 9, wherein: the bias voltage provided by the bias correction circuit is selected from a range of approximately 0.2 volts to approximately 0.7 volts.

16. The method of claim 15, wherein the LDO is configured to provide the regulated voltage selected from a range of approximately 1.5 volts to approximately 2.8 volts.

17. A method comprising:
receiving infrared (IR) radiation from a scene at a focal plane array (FPA) comprising:
a first die comprising an array of active bolometers and a selected portion of a read-out integrated circuit (ROIC) for the array of active bolometers, the selected portion of the ROIC comprising analog circuitry configured to provide analog signals in response to the IR radiation received by the array of active bolometers,
a second die comprising a remainder of the ROIC for the array of active bolometers such that components of the ROIC are distributed between the first and the second die, the first die stacked on top of the second die to expose the array of active bolometers for receiving the IR radiation, and
a plurality of inter-die connections between the first die and the second die;
passing signals between the first die and the second die through the inter-die connections; and
generating output values corresponding to the IR radiation received at the array of active bolometers, wherein the passed signals are used to perform the generating;
providing a bias voltage to the array of active bolometers by a bias correction circuit implemented on the first die, providing a regulated voltage from a low-dropout regulator (LDO) implemented on the second die to the bias correction circuit via one or more of the plurality of inter-die connections, wherein the providing of the bias voltage by the bias correction circuit is in response to receiving the regulated voltage from the LDO.

18. The method of claim 17, wherein:
the analog circuitry of the selected portion of the ROIC on the first die comprises one or more amplifiers;
the FPA comprises a cap adapted to seal at least a portion of the first die;
the first die and the cap form a vacuum package assembly (VPA); and the generating the output values comprises amplifying detected signals from the array of active bolometers by the one or more amplifiers on the first portion of the ROIC to provide the analog signals.

19. The method of claim 18, wherein:
the amplifying the detected signals comprises integrating the detected signals from the array of active bolometers to provide the analog signals;
the passing comprises passing the analog signals from the selected portion of the ROIC on the first die to the remainder of the ROIC on the second die; and
the generating the output values further comprises converting, by the remainder of the ROIC on the second die, the analog signals into at least one of the output values.

20. The method of claim 17, wherein:
the selected portion of the ROIC on the first die comprises a temperature sensor adapted to detect a temperature associated with the first die; and
the generating the output values comprises compensating for temperature-dependent variations in the output values based on the temperature detected by the temperature sensor.

21. The method of claim 17, wherein:
the inter-die connections comprise through-silicon vias (TSVs) and/or micro-bumps.

22. The method of claim 17, wherein the first die is fabricated using a first fabrication process optimized for high power and/or low noise components and the second die is fabricated using a second fabrication process optimized for digital circuitry to accommodate lower power usage and/or higher density than the first fabrication process.

23. The method of claim 17, further comprising the bias voltage being selected from a range of approximately 0.2 volts to approximately 0.7 volts.

24. The method of claim 23, wherein the regulated voltage from the LDO is selected from a range of approximately 1.5 volts to approximately 2.8 volts.

* * * * *